United States Patent
Masui et al.

(10) Patent No.: US 7,480,230 B2
(45) Date of Patent: Jan. 20, 2009

(54) LIGHT SOURCE DRIVE, OPTICAL INFORMATION RECORDING APPARATUS, AND OPTICAL INFORMATION RECORDING METHOD

(75) Inventors: Naruhiro Masui, Kanagawa (JP); Hidetoshi Ema, Kanagawa (JP)

(73) Assignee: Ricoh Company, Ltd. (JP)

( * ) Notice: Subject to any disclaimer, the term of this patent is extended or adjusted under 35 U.S.C. 154(b) by 220 days.

(21) Appl. No.: 11/581,483

(22) Filed: Oct. 17, 2006

(65) Prior Publication Data
US 2007/0036059 A1 Feb. 15, 2007

Related U.S. Application Data

(62) Division of application No. 11/213,829, filed on Aug. 30, 2005, now Pat. No. 7,193,957, which is a division of application No. 10/606,780, filed on Jun. 27, 2003, now Pat. No. 6,954,415.

(30) Foreign Application Priority Data

| Jul. 3, 2002 | (JP) | ............... 2002-194161 |
| Jul. 26, 2002 | (JP) | ............... 2002-218559 |
| Jun. 9, 2003 | (JP) | ............... 2003-164054 |

(51) Int. Cl.
*G11B 7/00* (2006.01)
(52) U.S. Cl. ........................ 369/121; 369/116
(58) Field of Classification Search ............... None
See application file for complete search history.

(56) References Cited

U.S. PATENT DOCUMENTS

| 4,894,816 A | 1/1990 | Sukeda et al. |
| 5,036,519 A | 7/1991 | Ema et al. |
| 5,050,177 A | 9/1991 | Ema |
| 5,138,623 A | 8/1992 | Ema et al. |
| 5,237,579 A | 8/1993 | Ema et al. |
| 5,258,780 A | 11/1993 | Ema et al. |
| 5,325,160 A | 6/1994 | Imakawa et al. |
| 5,418,770 A | 5/1995 | Ide et al. |
| 5,471,492 A * | 11/1995 | Pidgeon et al. .......... 372/38.08 |
| 5,732,061 A | 3/1998 | Kirino et al. |
| 5,784,091 A | 7/1998 | Ema et al. |
| 5,790,482 A | 8/1998 | Saga et al. |

(Continued)

FOREIGN PATENT DOCUMENTS

EP 0 678 982 A2 10/1995

(Continued)

OTHER PUBLICATIONS

Japanese Office Action dated Jun. 17, 2008.

*Primary Examiner*—Muhammad N. Edun
(74) *Attorney, Agent, or Firm*—Dickstein Shapiro LLP

(57) ABSTRACT

A light source drive which modulates a light source so as to cause the same to emit a light, includes: a superposition current generation part which generates a superposition current approximately corresponding to a charging/discharging current needed for a capacitance occurring in parallel to the light source for a predetermined time period near at least one of a rising-up part and a decaying-down part of a waveform of a drive current for the light source; and an addition/subtraction part which adds to or subtracts from the drive current the superposition current generated by the superposition current generation part.

2 Claims, 19 Drawing Sheets

U.S. PATENT DOCUMENTS

| | | |
|---|---|---|
| 5,822,346 A | 10/1998 | Arai |
| 5,946,334 A | 8/1999 | Ema et al. |
| 6,118,798 A | 9/2000 | Ema et al. |
| 6,280,810 B1 | 8/2001 | Nakamura et al. |
| 6,442,183 B1 | 8/2002 | Ema |
| 6,496,459 B2 | 12/2002 | Ueki |
| 6,498,617 B1 | 12/2002 | Ishida et al. |
| 6,556,523 B1 | 4/2003 | Masui |
| 6,600,712 B1 | 7/2003 | Masui et al. |
| 2002/0051137 A1 | 5/2002 | Ema et al. |
| 2002/0130944 A1 | 9/2002 | Ema et al. |
| 2002/0158965 A1 | 10/2002 | Ema |
| 2002/0196717 A1 | 12/2002 | Masui et al. |
| 2003/0025785 A1 | 2/2003 | Nihei et al. |
| 2003/0035451 A1 | 2/2003 | Ishida et al. |
| 2003/0112732 A1 | 6/2003 | Masui et al. |

FOREIGN PATENT DOCUMENTS

| | | |
|---|---|---|
| EP | 0 802 531 | 10/1997 |
| EP | 0 827 141 A2 | 3/1998 |
| EP | 0 829 952 A2 | 3/1998 |
| EP | 1052631 A2 | 11/2000 |
| EP | 1 174 862 A2 | 1/2002 |
| JP | 59-129949 A | 7/1984 |
| JP | 60-25032 A | 2/1985 |
| JP | 05-290437 | 5/1993 |
| JP | 8-287465 | 11/1996 |
| JP | 10-003664 | 6/1998 |
| JP | 10-308026 | 11/1998 |
| JP | 2000-11382 | 1/2000 |
| WO | WO 02/51009 A1 | 8/2002 |

* cited by examiner

FIG.1
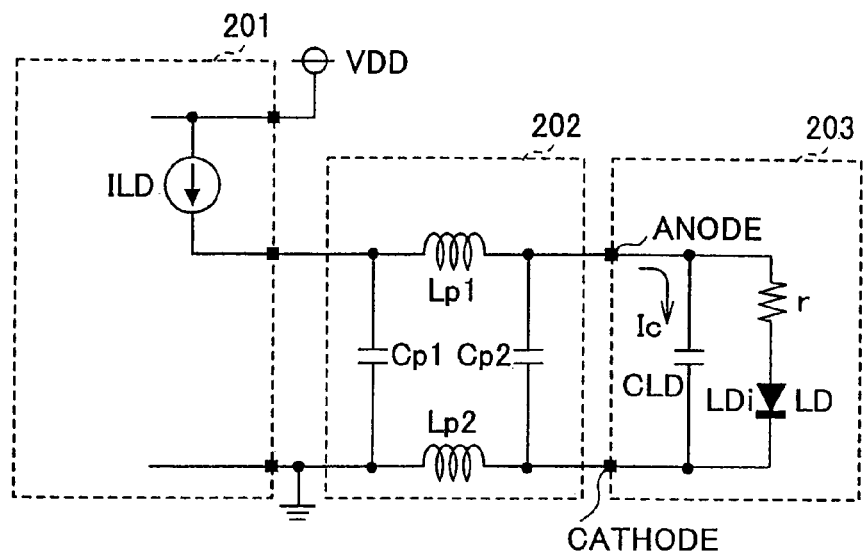
FIG.2A
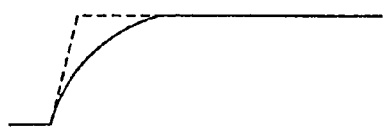
FIG.2B
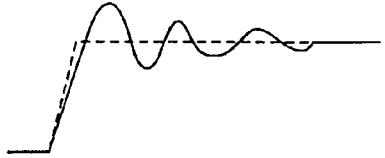
FIG.2C

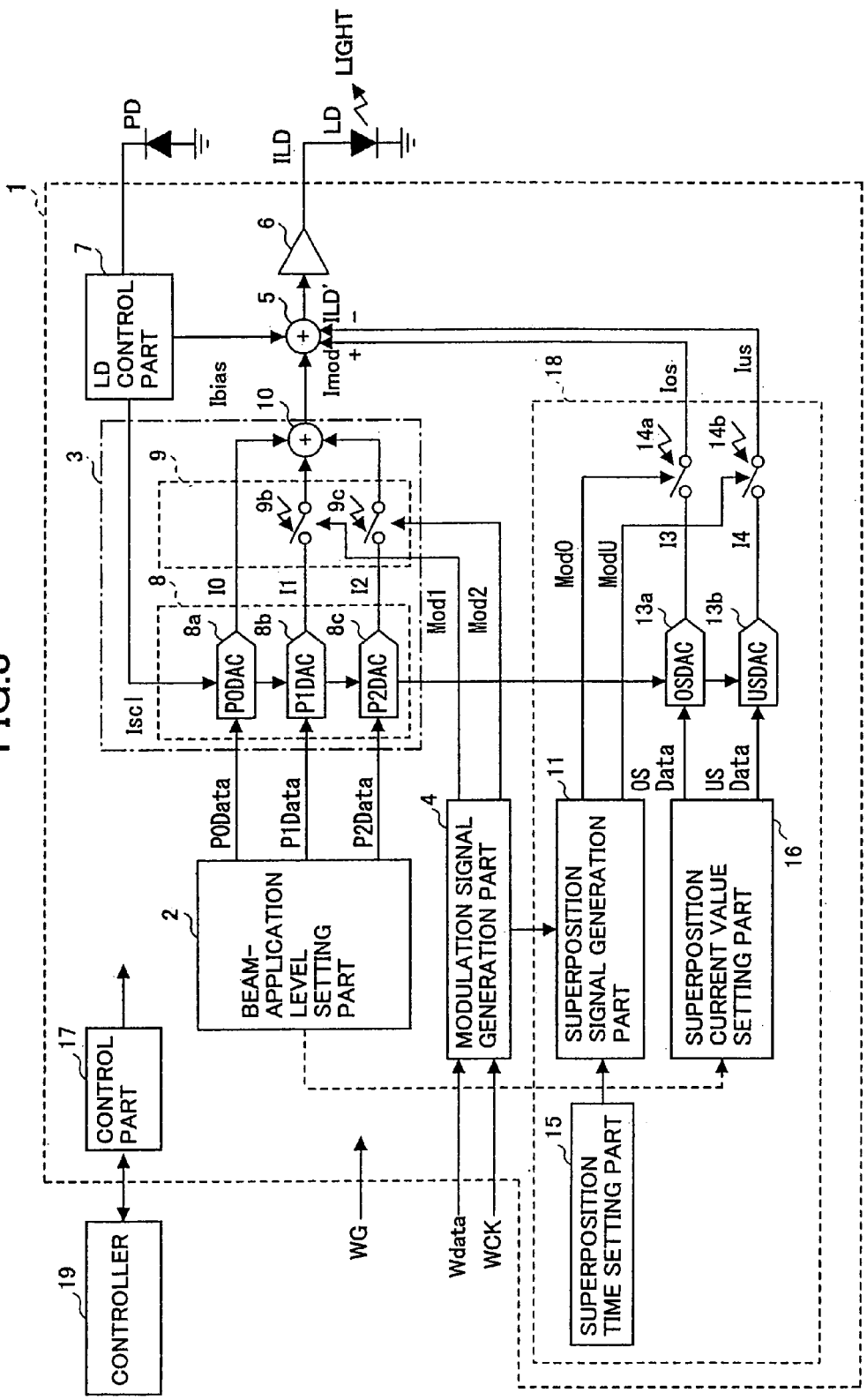

LIGHT SOURCE DRIVE, OPTICAL INFORMATION RECORDING APPARATUS, AND OPTICAL INFORMATION RECORDING METHOD

CROSS-REFERENCE TO RELATED APPLICATION

This application is a divisional of U.S. patent application Ser. No. 11/213,829, filed on Aug. 30, 2005; now U.S. Pat. No. 7,193,957 which is a divisional of U.S. patent application Ser. No. 10/606,780, filed on Jun. 27, 2003, now U.S. Pat. No. 6,954,415 the disclosures of which are hereby incorporated in their entireties by reference herein.

BACKGROUND OF THE INVENTION

1. Field of the Invention

The present invention relates to a light source drive which drives a semiconductor laser or so which is a light source used in an optical disk drive or an optical information recording apparatus, such as a CD-R drive, a CD-RW drive, a DVD-R drive, a DVD-RW drive, a DVD+RW drive, a DVD-RAM drive, or so, such an optical information recording apparatus, and an optical information recording method applied therein.

2. Detailed Description of the Related Art

Conventionally, in an optical disk drive, a light source such as a semiconductor laser light source (laser diode or LD) which is a light source is appropriately modulated so as to emit a laser beam, which is applied to an optical information recording medium (optical disk), and thus, information recording and information reproduction are performed thereon. For example, in a phase-change type optical disk used as a CD-RW disk, a DVD+RW disk, etc., an amorphous state, i.e., a recording mark, is formed by increasing the temperature of the recording medium to more than the melting point thereof, and carrying out a sudden cooling thereof so that it is cooled within the crystallization time of the recording medium.

That is, in order to form a properly-shaped record mark and well control the position thereof on the recording medium such as an optical disk, the beam application energy and time duration thereof should be controlled correctly, and it is necessary to generate an exact light waveform in the laser beam. Especially, in case high-speed information writing is required, a control of the characteristic of rising-up and decaying-down of the light waveform is an essential matter.

For example, in a write-once disk employing a pigment such as a CD-R disk, a DVD+R disk, etc., a record mark is formed by producing a thermal deformation occurring from a beam-application or a substrate transformation occurring therefrom so as to cause an optical transformation there.

Accordingly, in order to achieve a proper record mark formation and a position control thereof, it is necessary to generate an exact light waveform in the laser beam applied onto the optical recording medium.

According to Japanese laid-open patent application No. 10-308026, for example, in case of employing a pulse series for driving a laser for well controlling a recording area of an optical recording medium, a snubber circuit is applied so as to absorb a starting power occurring due to a parasitic inductance. Thereby, it is possible to prevent overshooting or ringing otherwise occurring in a laser driving beam waveform due to the parasitic inductance included in a circuit used for transmitting the driving signal up to the laser with high-frequency components included in the pulse series.

With regard to other types of optical recording media such as MO or MD for which a magnetic inversion phenomenon occurring near the Curie point is utilized, the same situation occurs.

In such a conventional light source drive described above, the following problems to be solved are involved. FIG. 1 illustrates the problem occurring in a case of driving an LD (laser diode) in a conventional light source drive. FIG. 2 shows waveforms in case the LD is driven by the light source drive shown in FIG. 1.

In FIG. 1, in order to simplify the description, in an LD drive part 201, illustration is omitted except a source of current which supplies a drive current.

Generally speaking, some amount of junction capacitance occurs between an anode and a cathode of the LD (in addition, a parasitic capacitance also occurs there). In the figure, the reference numeral 203 indicates a simple LD equivalent model in consideration of this junction capacitance.

'CLD' in this LD equivalent model 203 indicates the above-mentioned junction capacitance (the above-mentioned parasitic capacitance is also included therein), 'r' indicates an ON resistance, and 'LDi' indicates an ideal LD. Due to the occurrence of the junction capacitance, even when a predetermined drive current is provided with a sharp rising-up and a sharp decaying-down in its waveform, i.e., of a rectangular waveform, as shown in FIG. 2A, a part of the current is to flow through the junction capacitance as a charging/discharging current Ic therefor. Accordingly, the current then flowing through the ideal LD (LDi) has not sufficiently sharp rising-up and decaying-down, i.e., rounded, as shown in FIG. 2B. As a result, it becomes not possible to drive the LD with a desired signal waveform such as that shown in FIG. 2A.

Thereby, it may not be possible to produce a precisely shaped record mark or a well controlled mark position on a relevant optical recording medium, and, thus, the data recording may include data errors accordingly.

Especially, in case of achieving high-speed recording of information onto an optical recording medium, an output of the LD should be increased accordingly. However, generally speaking, a high-output LD has a large junction capacitance, and, also, in this case, high-speed rising-up and decaying-down of signal waveform is essential. Accordingly, the above-mentioned problem of possible data error generation due to degradation in the signal waveform rising-up and decaying-down performance may become remarkably worse. This problem is referred to as a first problem.

Moreover, generally speaking, a transmission line 202 which provides the drive current from the LD drive part 201 to the LD is installed usually on a flexible printed circuit board (FPC), and in the transmission circuit 202, as shown in FIG. 1, parasitic inductances Lp1 and Lp2 and parasitic capacitances Cp1 and Cp2 may occur.

In case a high-speed modulation or driving of the LD is carried out, the signal of a high-frequency component causes a resonance phenomenon with these parasitic inductances etc. As a result, the drive current includes overshooting or ringing, as shown in FIG. 2C, and then, it may become not possible to achieve generation of a light beam with a desired waveform from the LD. Accordingly, record marks thus formed on the optical recording medium may not have proper shapes nor well-controlled positions, and, thus, as mentioned above, data errors may occur at a time when information reproduction is made from the recording medium. This problem is referred to as a second problem.

The above-mentioned first and second problems may occur simultaneously in combination in some cases.

SUMMARY OF THE INVENTION

A first purpose of the present invention is to solve these problems. Specifically, the first purpose is to control a distortion (a delay or a degradation in rising-up or decaying-down characteristics) otherwise occurring in a waveform of a light beam emitted from a light source such as an LD due to a junction capacitance of the LD, parasitic inductances of the transmission circuit, and, thus, to achieve a generation of the light beam with a desired waveform by solving these problems.

Moreover, the following problems may also occur when a high-speed operation is attempted in an optical disk derive. In an optical disk drive, since a high-speed operation and a high integration or miniaturization of the device have been demanded, a micro-fabricated CMOS process is considered advantageous to be applied therefor.

On the other hand, in such an LD drive, since a light source LD having an operation voltage in a range of 1 through several volts is connected thereto, a high-voltage process (for example, 5 volts, 3.3 volts or so) is also needed.

However, usually, in a micro-fabricated CMOS process, it is difficult to achieve such a high-voltage process. For example, a CMOS process of 0.18 μm has a withstand voltage of as high as 1.8 volts. Accordingly, it may become not possible to achieve high-speed operation, or, even it is possible, a considerable price increase, an increase in consumption power, an increase in size or so may occur for achieving the high-speed operation.

One scheme of controlling a signal for driving an LD acting as a light source will now be discussed for illustrating another problem to be solved. In this scheme, for example, predetermined modulation signals M0, M1 and M2 are generated according to predetermined drive waveform generation information held in driving waveform generation information storage in a modulation signal generation unit. Then, respective switches are provided for these modulation signals M0, M1, M2, . . . , and are appropriately controlled. Thereby, one or some thereof are selected, and, after that, the thus-selected signals are made to undergo an operation by means of an adder and a current drive part. Thereby, a multi-level drive current signal is produced from these signals thus-selected, and is provided to the LD. Thereby, the LD emits a multi-level laser beam. In this scheme, a delay amount control part is provided for generating signal difference amounts by which differences otherwise occurring among these source signals M0, M1, M2, . . . , should be controlled appropriately.

In this scheme, it is possible to reduce a distortion from a desired optical modulation waveform due to a signal distortion or a skew occurring in a modulation signal waveform. Accordingly, it becomes possible to employ a micro-fabricated CMOS process to the above-mentioned modulation signal generation unit which seeks high-speed operation and high integration or miniaturization of device. Also, it is possible to produce a signal processing part, controller and so forth needed in a light source drive into a single integrated circuit. Accordingly, it becomes possible to reduce the total manufacturing costs.

In this case, a problem occurring due to a skew occurring among the respective modulation signals, or so, in case of signal transmission via the FPC substrate can also be solved.

Further, in order to solve the above-mentioned first and second problems in a scheme in which the above-mentioned modulation signal generation unit and the LD drive part are provided separately, a superposition current generation part may be provided for providing a predetermined overshoot current and a predetermined undershoot current, by which possible overshooting and undershooting amounts in a modulation signal such as those shown in FIG. 2C are cancelled out.

However, when this superposition current generation part is provided together with the modulation signal generation part in a single integrated circuit (IC) for the purpose of price reduction and improvement in the manufacturing accuracy, different from a case of an integrated circuit containing the LD drive part, a problem may occur. That is, as superposition signals provided by the superposition current generation part should be transmitted to the LD drive part together with the modulation signals provided by the modulation signal generation part. Accordingly, for the purpose of transmission of these signals, the FPC substrate used therefor should have a larger width, and, also, the integrated circuit should have an increased number of interface pins. Accordingly, price reduction and miniaturization of the system may be obstructed.

Accordingly, a second object of the present invention is to achieve a miniaturization and a price reduction of the light source drive, while the light source drive should emit a light beam with a desired signal waveform (or light waveform) by solving the problem of degradation of the light waveform otherwise occurring due to a delay in rising-up/decaying-down (or edge rounding) or ringing of waveform which may otherwise occur due to the junction capacitance of the LD or the parasitic inductance of the transmission circuit.

A light source drive according to the present invention which modulates a light source so as to cause the same to emit a light, includes: a waveform shaping part which corrects a deformation of a light waveform of the light to be emitted from the light source.

A light source drive according to another aspect of the present invention which modulates a light source so as to cause the same to emit a light, includes: a superposition current generation part which generates a superposition current approximately corresponding to a charging/discharging current needed for a capacitance occurring in parallel to the light source for a predetermined time period near at least one of a rising-up part and a decaying-down part of a waveform of a drive current of the light source; and an addition/subtraction part which adds to or subtracts from the drive current the superposition current generated by the superposition current generation part.

A light source drive according to another aspect of the present invention which modulates a light source so as to cause the same to emit a light, includes: an output impedance control part which changes an output impedance value of a drive current output part which provides a drive current to the light source, for a predetermined time period near at least one of a rising-up part and a decaying-down part of a waveform of the drive current.

A light source drive according to another aspect of the present invention which modulates a light source so as to cause the same to emit a light, includes: a MOS transistor connected in parallel with a drive current output part which outputs a drive current to the light source; and a voltage control part which applies a voltage to a gate of the MOS transistor such that the MOS transistor enters a linear region for a predetermined time period near at least one of a rising-up part and a decaying-down part of a waveform of the drive current.

A light source drive according to another aspect of the present invention which modulates a light source so as to cause the same to emit a light, includes: a superposition current generation part which generates a superposition current approximately corresponding to a charging/discharging current needed for a capacitance occurring in parallel to the light source for a predetermined time period near at least one of a rising-up part and a decaying-down part of a waveform of a drive current of the light source; an addition/subtraction part which adds to or subtracts from the drive current the superposition current generated by the superposition current generation part; and an output impedance control part which changes an output impedance value of a drive current output part which provides the drive current to the light source, for a predetermined time period near at least one of a rising-up part and a decaying-down part of a waveform of the drive current.

A light source drive according to another aspect of the present invention which modulates a light source so as to cause the same to emit a light, includes: a superposition signal generation part which generates a superposition signal which indicates a predetermined time period near at least one of a rising-up part and a decaying-down part-of a waveform of a drive current of the light source; a superposition current generation part which generates a superposition current approximately corresponding to a charging/discharging current needed for a capacitance occurring in parallel to the light source based on the superposition signal generated by the superposition signal generation part; an addition/subtraction part which adds to or subtracts from the drive current the superposition current generated by the superposition current generation part; and an output impedance control part which changes an output impedance value of a drive current output part which provides the drive current to the light source, for a predetermined time period near at least one of a rising-up part and a decaying-down part of a waveform of the drive current.

A light source drive according to another aspect of the present invention which modulates a light source so as to cause the same to emit a light, includes: a waveform shaping part which corrects a deformation of a light waveform of the light to be emitted from the light source; and a waveform shaping time control part which controls a time period for which the waveform shaping part performs a waveform shaping operation.

A light source drive according to another aspect of the present invention includes: a light source modulation part which modulates a light source so as to cause the same to emit a light; a superposition current generation part which generates a superposition current in a predetermined amount for a predetermined time period near at least one of a rising-up part and a decaying-down part of a waveform of a drive current of the light source; an addition/subtraction part which adds to or subtracts from the drive current the superposition current generated by the superposition current generation part; and a superposition time control part which controls the predetermined time period so as to cause it to have a predetermined value.

A light source drive according to another aspect of the present invention includes: a light source modulation part which modulates a light source so as to cause the same to emit a light; an output impedance control part which changes an output impedance value of the light source modulation part for a predetermined time period near at least-one of a rising-up part and a decaying-down part of a waveform of a drive current of the light source; and a time control part which controls the predetermined time period so as to cause it to have a predetermined value.

A light source drive according to another aspect of the present invention includes: a light source modulation part which modulates a light source so as to cause the same to emit a light; a superposition current generation part which generates a superposition current in a predetermined amount for a first predetermined time period near at least one of a rising-up part and a decaying-down part of a waveform of a drive current of the light source; an addition/subtraction part which adds to or subtracts from the drive current the superposition current generated by the superposition current generation part; an output impedance control part which changes an output impedance value of the light source modulation part for a second predetermined time period near at least one of a rising-up part and a decaying-down part of a waveform of a drive current of the light source; and a time control part which controls the first predetermined time period and the second predetermined time period so as to cause them to have predetermined values.

Thus, according to the present invention, a distortion of a light waveform otherwise occurring due to a junction capacitance of an LD, a parasitic inductance of transmission circuit, or so, can be corrected with a simple configuration, and thereby, a laser beam is produced with a desired light waveform, effectively. Further, it is also possible to effectively miniaturize or reduce in price of an optical information recording apparatus while fine control of light waveform of a laser beam applied to an optical recording medium is maintained at a high grade.

An optical information recording method of forming a record mark on a recording medium by applying a light emitted from a light source in a form of a pulse series according to the present invention, includes the steps of: a) adding a pulse of predetermined power for a predetermined time period after near a rising-up part of at least some pulses of the pulse series; and b) controlling a pulse width of the pulse thus added so as to control the formation of the record mark.

An optical information recording method of forming a record mark on a recording medium by applying a light emitted from a light source in a form of a pulse series according to another aspect of the present invention, includes the steps of: a) adding a first addition pulse of predetermined power for a predetermined time period after near a rising-up part of at least some pulses of the pulse series; b) adding a second addition pulse of predetermined power for a predetermined time period after near a decaying-down part of the at least some pulses of the pulse series; and c) controlling a pulse width of the first addition pulse thus added and a pulse width of the second addition pulse thus added so as to control the formation of the record mark.

An optical information recording method of forming a record mark on a recording medium by applying a light emitted from a light source in a form of a pulse series according to another aspect of the present invention, includes the steps of: a) adding or subtracting a predetermined addition current to a drive current of the light source for a predetermined time period after near a rising-up part or a decaying-down part of at least some pulses of the pulse series; b) determining the predetermined time for the addition current such that part of the addition current is approximately appropriated for charging/discharging a capacitance occurring in parallel to the light source and the remaining part of the addition current is used as an addition power to be applied, so as to control the formation of the record mark.

An optical information recording apparatus according to the present invention for forming a record mark on a recording medium by applying a light emitted from a light source in a form of a pulse series, includes: an addition current generation part which generates an addition current in a predetermined value for a predetermined time period after near a rising-up part of at least some pulses of the pulse series; an addition time setting part which determines the predetermined time period for the addition current; and an adding part which adds the addition current to a drive current of the light source.

An optical information recording apparatus according to another aspect of the present invention for forming a record mark on a recording medium by applying a light emitted from a light source in a form of a pulse series, includes: an addition current generation part which generates an addition current in a predetermined value for a predetermined time period after near a rising-up part or a decaying-down part of at least some pulses of the pulse series; an addition time setting part which determines the predetermined time period for the addition current; and an adding/subtracting part which adds/subtracts the addition current to a drive current of the light source.

An optical information recording apparatus according to another aspect of the present invention for forming a record mark on a recording medium by applying a light emitted from a light source in a form of a pulse series, includes: an addition current generation part which generates an addition current in a predetermined value for a predetermined time period after near a rising-up part or a decaying-down part of at least some pulses of the pulse series; an addition time setting part which sets the predetermined time for the addition current such that part of the addition current is approximately appropriated for charging/discharging a capacitance occurring in parallel to the light source and the remaining part of the addition current is used as an addition power to be applied; and an adding/subtracting part which adds/subtracts the addition current to a drive current of the light source.

Thus, according to the present invention, it becomes also possible to effectively increase the resolution of beam-application energy so as to achieve fine control of record mark formation even in case of high-speed recording, without increasing the time-axis resolution in a beam-application time duration or in a cooling time duration.

BRIEF DESCRIPTION OF THE DRAWINGS

FIG. 1 illustrates a problem in a case of driving an LD with a conventional light source drive;

FIGS. 2A, 2B and 2C show light waveforms in an example when an LD is driven with the light source drive shown in FIG. 1;

FIG. 3 shows a block diagram of a configuration of a light source drive according to a first embodiment of the present invention;

DETAILED DESCRIPTION OF THE PREFERRED EMBODIMENTS

Hereafter, embodiments of the present invention will be specifically described based on the drawings.

A first embodiment of the present invention will now be described.

Figure 4:
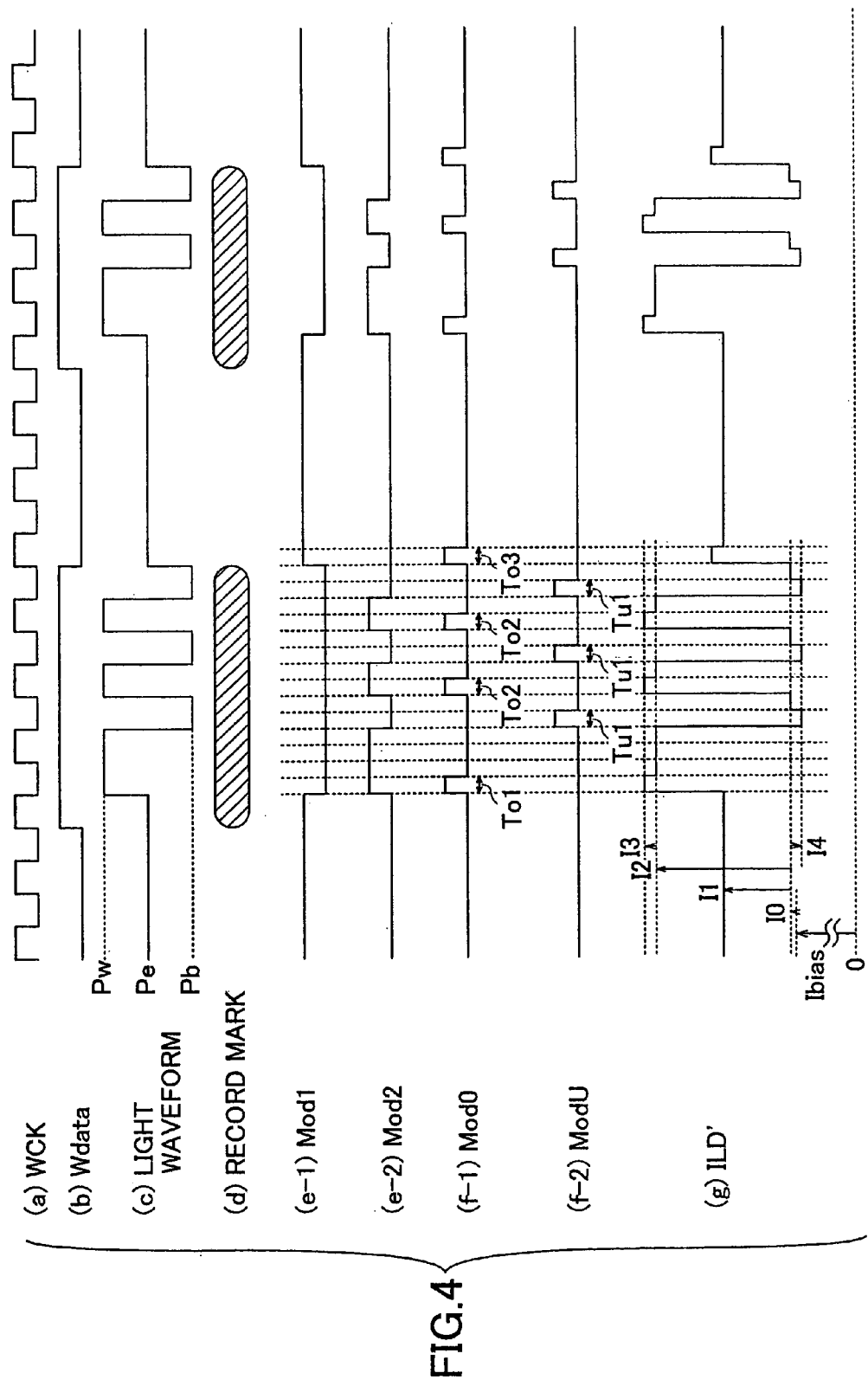
FIG. 4 shows waveforms of signals occurring in the light source drive according to the first embodiment of the present invention.

FIG. 3 is a block diagram showing a configuration of a light source drive according to the first embodiment of the present invention. The light source drive according to the first embodiment is directed to solve the above-mentioned first problem. Moreover, FIG. 4 shows a waveform showing an example of each signal occurring in the light source drive according to the first embodiment.

The light source drive 1 includes a beam-application level setting part 2 which sets beam-application levels P0, P1, and P2 of an LD as shown in FIG. 3 (beam-application level control part). A modulation signal generation part 4 also included in the light source drive 1 generates modulation signals Mod1 and Mod2 for the LD from a record data signal Wdata and a record clock signal WCK. Further, a modulation part 3 also included in the light source derive 1 generates an LD modulation current Imod based on beam-application level data P0Data, P1Data, P2Data corresponding to the beam-application levels P0, P1, and P2 of the LD, respectively, and the modulation signals Mod1 and Mod2.

A superposition current generation part 18 generates an overshoot current Ios and an undershoot current Ius which are superposition currents based on modulation timings (which correspond to rising-up or decaying-down timings of the modulation signals Mod1 and Mod2, or to their parts) which the modulation signal generation part 4 generates. An LD control part 7 also shown controls a bias current Ibias and a scale signal Iscl which indicates a scale of a modulation current so that a light emission amount of the LD becomes a desired value based on a monitored light-receiving signal, which is input from a monitoring PD which monitors a part of the emitted light of the LD.

An addition-and-subtraction part 5 also shown adds the LD modulation current Imod and the bias current Ibias together, further adds thereto the overshoot current Ios, and subtracts the undershoot current Ius therefrom. A current drive part 6 amplifies a current ILD' thus produced by the addition-and-subtraction part 5 and provides a drive current ILD to the LD. A control part 17 receives control commands provided by a controller 19 which controls the entirety of an information recording apparatus which includes the above-mentioned light source drive 1, and provides control signals to the respective parts.

Next, a detailed internal configuration of the modulation part 3 will now be described. The modulation part 3 includes a source 8 of current which supplies currents I0, I1, and I2 based on the beam-application level data P0Data, P1Data, and P2Data, respectively, which source actually includes respective current sources P0DAC 8a, P1DAC 8b, and P2DAC 8c. Switches 9b and 9c carry out an on-off control of the currents I1 and I2 according to the modulation signals Mod1 and Mod2, respectively, and an addition part 10 which adds each current together which the switches 9 output, and thus supplies an LD modulation current Imod.

Next, a detailed internal configuration of the superposition current generation part 18 will now be described. The superposition current generation part 18 includes a superposition signal generation part 11 which generates superposition signals (respectively, ModO and ModU) which specify periods for which the overshoot current Ios and undershoot current Ius are superposed based on the modulation timings which the modulation signal generation part 4 generates, respectively. A superposition current value setting part 16 sets current values I3 and I4 of the overshoot current Ios and undershoot current Ius, and supplies setting data OSData and USData.

Current sources OSDAC 13a and USDAC 13b supply the currents I3 and I4 based on the overshoot current setting data OSData and the undershoot current setting data USData, respectively. Switches 14a and 14b carry out an on-off control of the currents I3 and I4 according to the superposition signals ModO and ModU, respectively, and generate the overshoot current Ios and the undershoot current Ius. A superposition time setting part 15 sets respective superposition times for the overshoot current Ios and undershoot current Ius.

FIG. 4 shows a waveform in an example of a main signal of each part shown in FIG. 3. This figure shows a case at a time of recording information to a phase-change type recording medium. In FIG. 4, a waveform (c) is a desired light waveform, and record marks shown in (d) are formed from application of this light waveform. Levels Pb, Pe, and Pw of the light waveform (c) are respective beam-application levels of a bottom power level, an erase power level, and a light power level, respectively, and are beam-application levels for which the current ILD' is set to (Ibias+I0), (Ibias+I0+I1), and (Ibias+I0+I2), respectively. That is, the beam-application level is determined by the beam-application level data P0Data, P1Data, and P2Data, which set the current values I0, I1, and I2, respectively.

The modulation signals Mod1 (e-1) and Mod2 (e-2) in FIG. 4 are generated corresponding to the record data Wdata (b) based on drive waveform information that indicates desired modulation timing of the light waveform beforehand set in the modulation signal generation part 4.

The superposition signal ModO (f-1) shown in FIG. 4 is generated so as to have a high level only during the superposition time periods (To1, To2, To3) for the overshoot current according to instructions coming from the superposition time setting part 15 in synchronization with the rising-up of the modulation signal Mod1 or Mod2, in the superposition signal generation part 11. Thereby, the overshoot current Ios is generated and is added to the LD drive current.

Similarly, the superposition signal ModU (f-2) shown in the same figure is generated so as to have a high level only during the superposition time periods (Tu1) for the undershoot current according to instructions coming from the superposition time setting part 15 synchronized with the decaying-down of the modulation signal Mod2.

According to these modulation signals and superposition signals, the current ILD' (g) is generated. The drive current ILD finally supplied to the LD is obtained from appropriately amplifying the above-mentioned current ILD' via an amplifier 6.

That is, the current waveform is obtained superposed with the overshoot current Ios at the time of the rising-up of drive current, while superposed with the undershoot current Ius at the time of decaying-down thereof. Current levels I0 through I4 shown in the figure are current values generated in the current sources 8 and 13, respectively, and the current Ibias corresponds to a threshold current of the LD provided by the LD control part 7.

The overshoot current Ios and the undershoot current Ius thus generated and superposed are used as charging/discharging currents for the junction capacitance of the LD. Accordingly, a delay of rising-up/decaying-down timing or rounding of the light waveform can be avoided. Accordingly, a light can be made to be emitted with a desired light waveform from the LD, and thus, exact record marks can be formed on the optical recording medium thereby.

The junction capacitance may differ according to a particular product of the LD applied. Accordingly, it is preferable that the above-mentioned superposition current values should be preferably adjusted accordingly. Thereby, appropriate charging/discharging of the junction capacitance of the LD can be achieved, thus, a still more ideal light waveform can be obtained, and a more excellent record mark formation can be performed. In the light source drive according to the first embodiment of the present invention, the superposition current value setting part 16 executes this function. The same effect is acquired by adjusting the superposition time of overshoot current Ios and undershoot current Ius, instead. In the light source drive of the first embodiment, the superposition time setting part 15 executes this function. It is also possible to combine these functions.

Furthermore, it is further preferable to adjust the current values and/or the superposition times of the overshoot current Ios and the undershoot current Ius according to changes of beam-application level. That is, according to changes in the beam-application level, i.e., Pe→Pw, Pb→Pw, Pb→Pe, the amounts of change in the potential across the cathode and anode of the LD differ, and thus, the charging/discharging current needed changes accordingly. Therefore, when the superposition times (To1, To2, To3) are controlled according to the thus changing beam-application level shift, a delay of the rising-up/delaying-down timing or rounding of the light waveform can be controlled more finely. The same effect can be acquired by controlling the current values.

Thus, according to the present embodiment, the waveform shaping device is provided to correct deformation occurring in light waveform resulting from the parasitic device occurring in the transmission line for the light source or the light source itself, such as parasitic capacitance or inductance. Accordingly, deformation (rounding of rising-up or decaying-down waveform, or ringing) in the light waveform can be well corrected, and thus, a light can be made to be emitted with a desired light waveform from the LD.

Moreover, according to the present embodiment, the superposition currents corresponding to the charging/discharging currents required for the capacitance occurring, in parallel, such as the junction capacitance of the light source on the rising-up or decaying-down of the drive current for the light source are superposed onto the drive current. Accordingly, the rising-up or decaying down of the light waveform can be prevented from being delayed or rounded otherwise occurring due to the above-mentioned capacitance occurring in parallel to the light source. Therefore, when this scheme is applied to an optical information recording apparatus such as an optical disk drive, formation of exact record marks can be achieved.

Furthermore, according to the present embodiment, the superposition time for which the superposition current is superposed onto the drive current of the light source may be controlled according to the capacitance occurring in parallel with the light source as mentioned above. Thereby, a delay or rounding of the rising-up or decaying-down of the light waveform can be appropriately cancelled according to a particular product of the light source applied. Thus, a light can be made to be emitted with a desired light waveform from the LD.

Moreover, according to the present embodiment, the superposition current value superposed to the drive current of the light source may be controlled according to the capacitance occurring in parallel with the light source. Thereby, according to the particular light source applied, a delay or rounding of the rising-up/decaying-down of the light waveform can be well cancelled, and light can be made to be emitted with a desired light waveform.

Furthermore, both the superposition times and the superposition current values, according to which the superposition current values are superposed on the drive current of the light source, may be controlled according to the capacitance occurring in parallel with the light source. Thereby, according to the light source applied, a delay or rounding of the rising-up/decaying-down of the light waveform can be well cancelled, and light can be made to be emitted with a desired light waveform.

Moreover, the superposition times for which the superposition currents are superposed to the drive current may be controlled according to the amount of change of the drive current of the light source. Thereby, a delay or rounding of the rising-up/decaying-down of the light waveform can be controlled more correctly.

Furthermore, the superposition current values superposed onto the drive current may be controlled according to the amount of change of the drive current of the light source. If so, a delay or rounding of the rising-up/decaying-down of the light waveform can be controlled more correctly.

Next, a second embodiment of the present invention will now be described.

Figure 5:
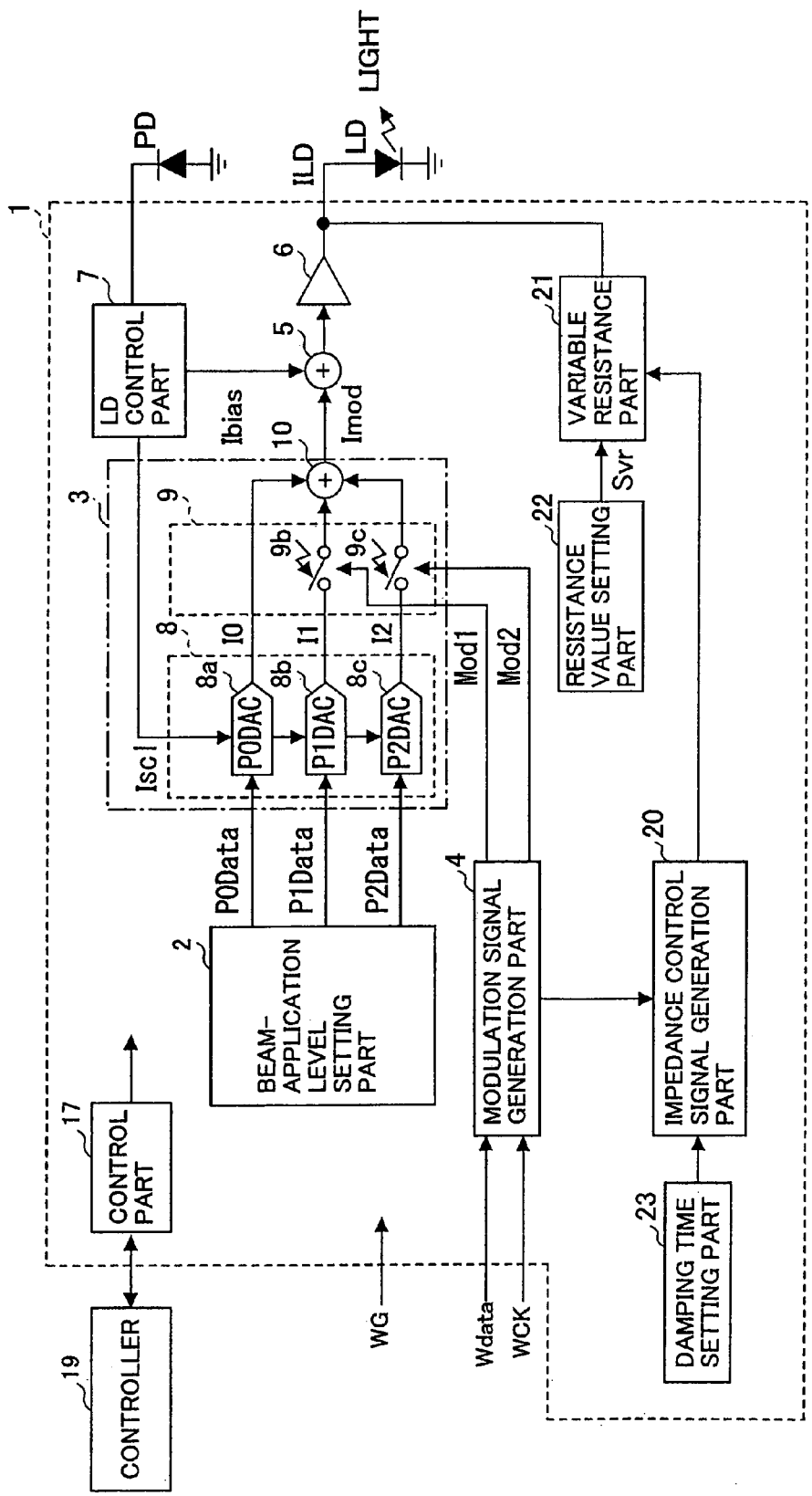
FIG. 5 shows a block diagram of a configuration of a light source drive according to a second embodiment of the present invention.

FIG. 5 shows a block diagram showing a configuration of a light source drive according to the second embodiment of the present invention. The light source drive of this embodiment solves the above-mentioned second problem. Each block having the same reference numeral as that shown in FIG. 3 performs the same operation and function as described, and, thus detailed description thereof will be omitted.

As shown in FIG. 5, in parallel with the source of current which provides the output current of the current drive part 6, a variable resistance part 21 is connected which controls the output impedance of the light source drive part 1. According to an impedance control signal ModZ, this variable resistance part 21 has a resistance Rd according to a resistance value setting signal Svr when the ModZ=High, while this has an approximately infinite resistance when the ModZ=Low.

A resistance setting part 22 generates the resistance setting signal Svr which indicates a resistance for a case where the lower impedance is provided by the variable resistance part 21 as mentioned above.

An impedance control signal generation part 20 starts up in synchronization with the modulation timing (which corresponds to the rising-up or decaying-down timing of the modulation signals Mod1 and Mod2, or a part thereof) supplied from the modulation signal generation part 4, and generates the impedance control signal ModZ having a high value only during a period set by a dumping time setting part 23. These parts 20 through 23 execute a function of controlling the output impedance of the LD driver.

Figure 6:
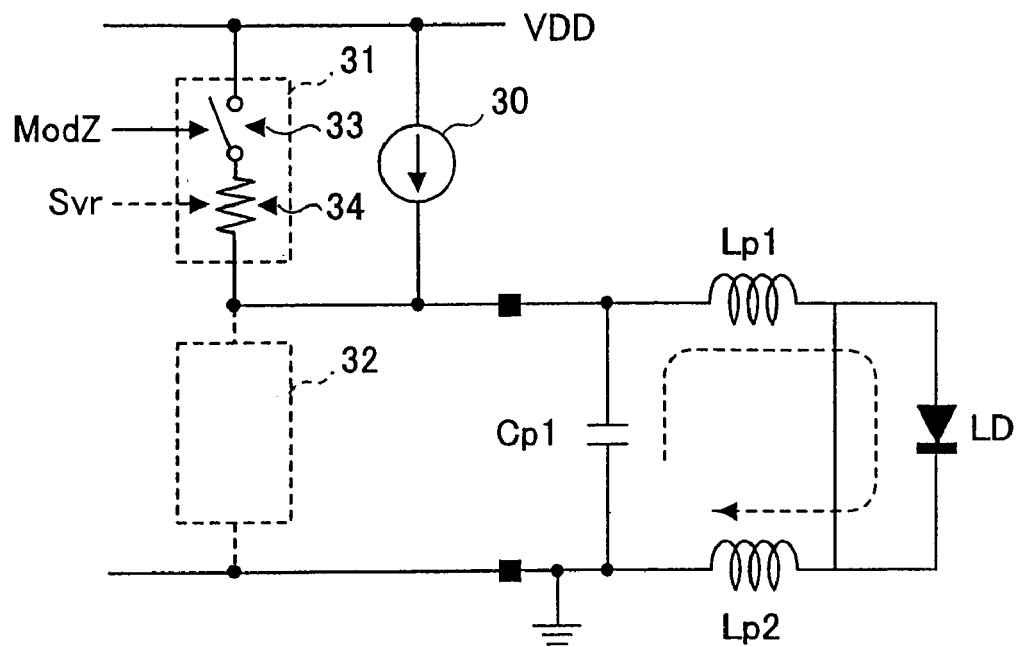
FIG. 6 shows a circuit diagram for illustrating operation of controlling a ringing of a light waveform otherwise occurring due to a parasitic inductance which is the second problem occurring in a conventional light source drive.

FIG. 6 shows a circuit diagram for illustrating control operation of a function of controlling a ringing of a light waveform occurring due to a parasitic inductance, which corresponds to the above-mentioned second problem.

A ringing of the light waveform occurs due to a resonance occurring in a loop indicated by a broken arrow shown in FIG. 6. It is effective to connect a resistance component to this loop in parallel, in order to control or well reduce this resonance. The resistance component should just be connected at a time of the rising-up/decaying-down of the drive current at which the ringing would otherwise occur. A current source 30 shown in FIG. 6 corresponds to a current source at an output stage which supplies an output current in the current drive part 6 shown in FIG. 5.

A variable resistance part 31 shown in FIG. 6 achieves the above-mentioned function, and the variable resistance part 21 shown in FIG. 5 corresponds thereto. This includes a switch 33 and a resistor 34, and an on-off control is carried out by the switch according to the impedance control signal ModZ. In case the resistor 34 is made of a variable resistor for which the resistance thereof is set by the resistance setting signal Svr, and the resistance is set according to the characteristic of the transmission circuit between the light source drive part 1 and the LD, the ringing can thus be controlled appropriately and as a result a light can be made to be emitted with a desired light waveform.

Moreover, as the power supply VDD and the ground are short-circuited in terms of AC operation, the variable resistance part 32 may be connected as shown in FIG. 6.

Figure 7:
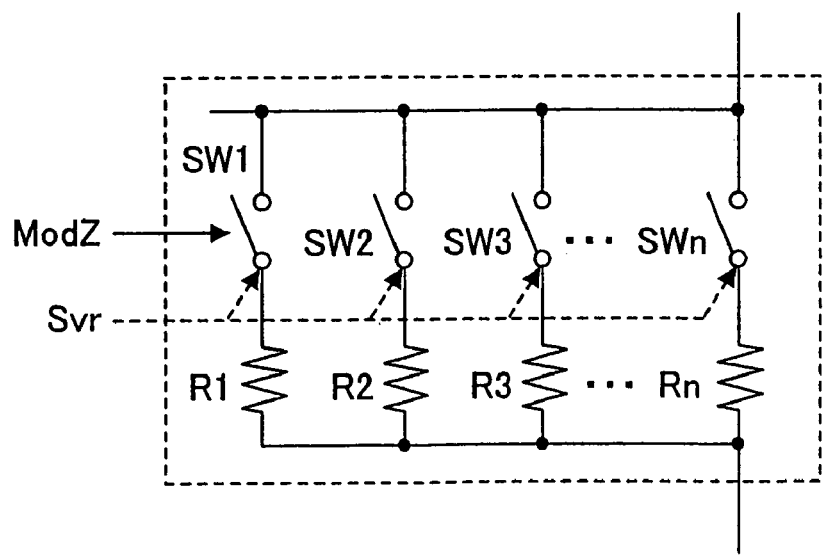
FIG. 7 shows another example of a configuration of a variable resistance part which may be applied to the second embodiment of the present invention.

FIG. 7 shows another example of the variable resistance part. This variable resistance part has a parallel connection of resistors R1 through Rn with switches SW1 through SWn connected in series therewith, respectively. One of the switch is selected according to the resistance setting signal. Svr, while an on-off control is performed on the thus-selected switch according to the impedance control signal ModZ. According to the thus-configured variable resistance part, it becomes possible to effectively control or well reduce the ringing suitably according to the transmission circuit characteristic with a simple configuration.

Figure 8A:
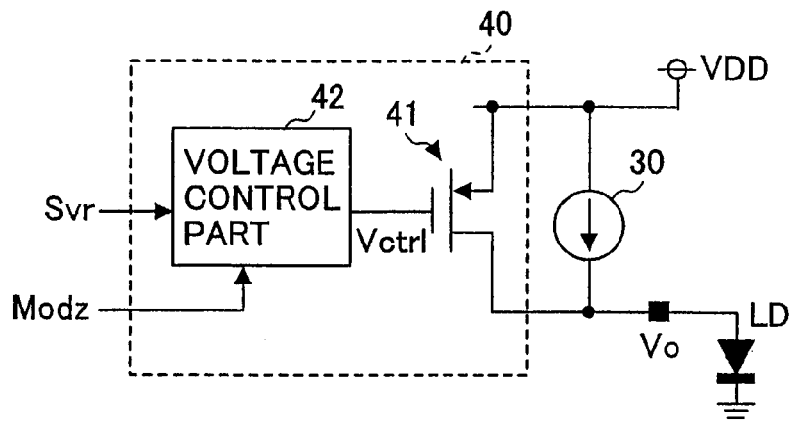
FIGS. 8A, 8B and 8C show another example of the variable resistance part, a waveform of an output signal thereof, and an Id-Vds characteristic of a MOS transistor shown in FIG. 8A, respectively.
Figure 8B:
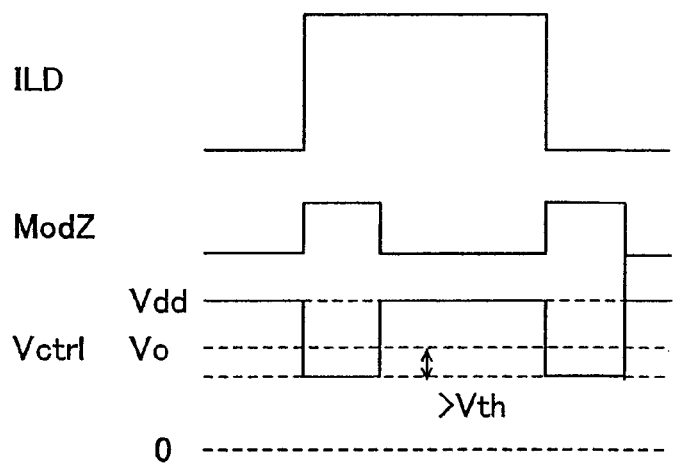
Figure 8C:
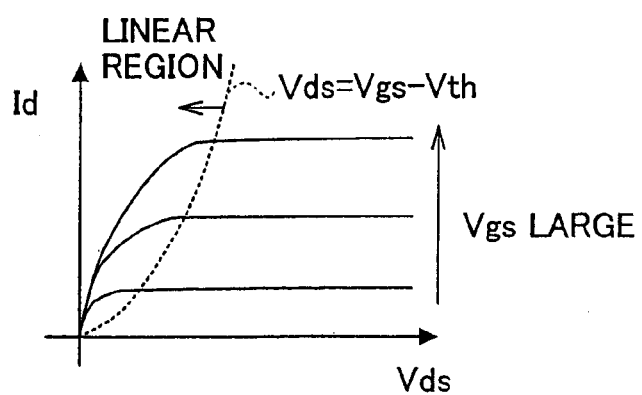

FIGS. 8A, 8B and 8C illustrate another example of the variable resistance part together with an output signal waveform thereof, and an Id-Vds characteristic of a MOS transistor. In this example, as shown in FIG. 8A, in parallel with a current source 30, a variable resistance part 40 including the MOS transistor 41 (here, it is of a p-channel type) and a voltage control part 42 which controls the gate voltage Vctrl of the MOS transistor 41 based on the impedance control signal ModZ and the resistance setting signal Svr.

The MOS transistor 41 acts as a voltage controlled resistance, when the voltage Vds between the drain and source becomes lower than the pinch-off voltage (in the linear region) (see FIG. 8C).

In this example, the gate voltage is controlled so that the transistor enters the linear region at a predetermined period at a time of rising-up/decaying-down of the drive current, while it enters the OFF state during all the other period.

That is, as shown in FIG. 8B, when the impedance control signal ModZ which shows a predetermined period at the rising-up/decaying-down of drive current ILD has a low level, the gate voltage Vctrl is made to be approximately equal to the power supply voltage Vdd (or Vgs should be below the threshold voltage Vth). When the ModZ has a high level, the control is made so that Vctrl<Vo−Vth (Vo is the terminal voltage of the LD). The resistance is gradually controllable by the Vctrl voltage value at the time the ModZ has the high level. Thereby, the ringing of, the light waveform can be well controlled with a sufficient accuracy even with a simple configuration.

According to the present embodiment, in comparison to the above-mentioned scheme of controlling the ringing with the snubber circuit, the light source drive is suitable to be integrated with a CMOS process, and also, even when the ringing mode varies due to variation of the transmission circuit characteristic or characteristic of the pickup device, the ringing otherwise occurring thereby can be well controlled through an appropriate setting of the resistance value according to the second embodiment of the present invention.

Thus, by controlling the output impedance of the drive current output part for the predetermined time period near at least one of the rising-up and decaying-down of the drive current for the light source, this acts as a dumping resistance component controlling the resonance which would otherwise occur due the parasitic inductance occurring in the wiring to the light source. Accordingly, the ringing or overshooting of the light waveform can be well controlled, and, thus, the light can be made to occur with a desired waveform. Thereby, when this light source is applied to an optical information recording apparatus, accurate record marks can be formed on an optical recording medium.

Further, as mentioned above, it is possible to achieve the above-mentioned control of output impendence of the drive current output part, by employing the MOS transistor connected in parallel with the drive current output part which outputs the drive current for the light source. In this case, a voltage is applied to the gate of the MOS transistor during a predetermined time period at least one of the rising-up and decaying-down of the drive current such that the transistor then enters the linear region. Thus, the ringing/overshooting of the light waveform can be well controlled with the simple configuration, and a light can be made to be emitted with a desired light waveform.

Furthermore, since the above-mentioned predetermined time can be controlled, the ringing/overshooting of the light waveform can be well controlled properly according to the wiring to the light source, and thus light can be made to be emitted with a desired light waveform.

Further, since the above-mentioned output impedance value can thus be controlled, the ringing/overshooting of the light waveform can be well controlled properly according to the wiring to the light source, and thus light can be made to be emitted with a desired light waveform.

Next, a third embodiment of the present invention will now be described.

Figure 9:
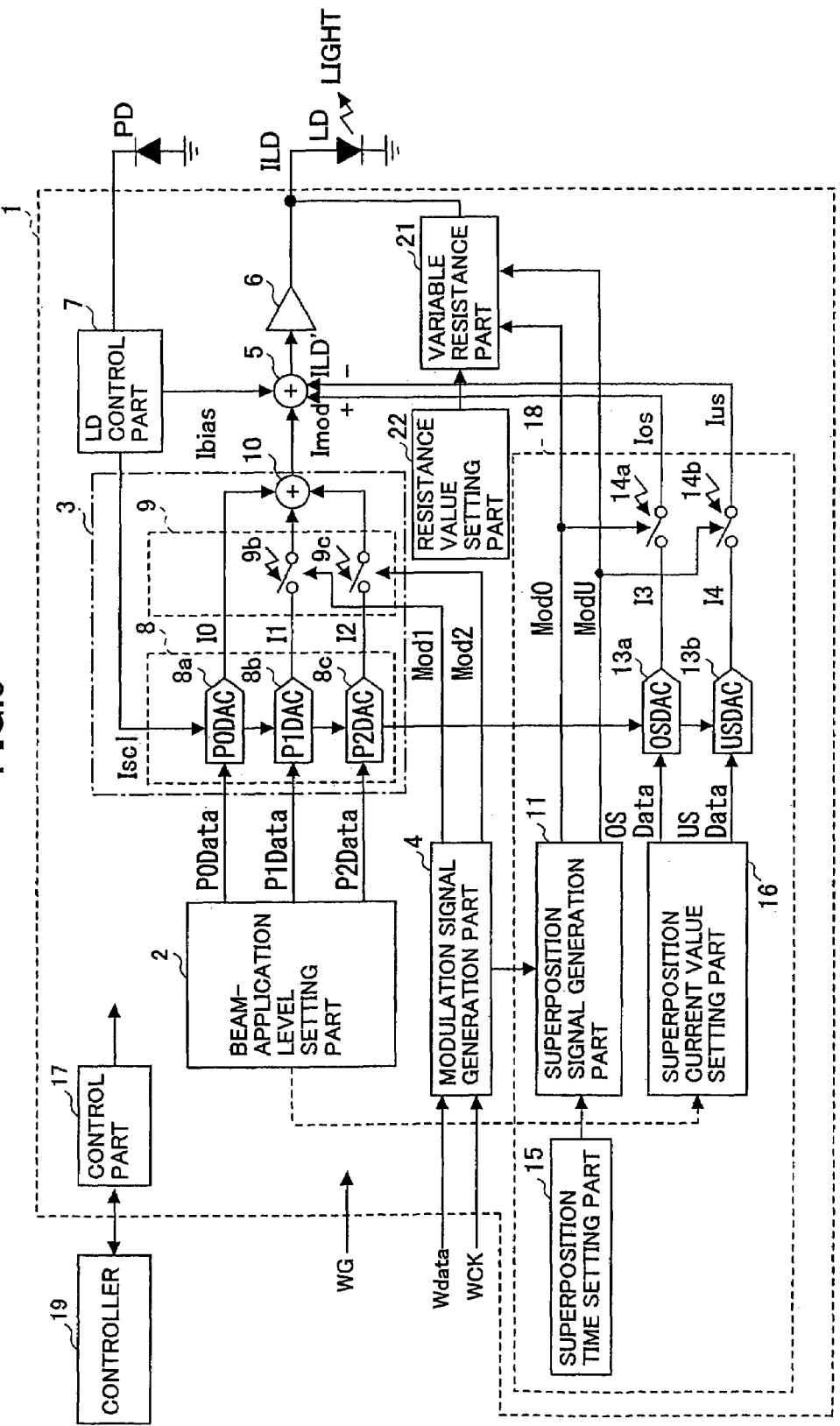
FIG. 9 shows a block diagram of a configuration of a light source drive according to a third embodiment of the present invention.

FIG. 9 shows a block diagram showing a configuration of a light source drive according to the third embodiment of the present invention. The light source drive of this embodiment solves the above-mentioned first and second problems simultaneously. Since the block of the same reference numeral as that shown in FIG. 3 performs the same operation and function described above, detailed description will be omitted therefor.

This light source drive includes the above-mentioned variable resistance part 21 and the above-mentioned resistance setting part 22 additionally in the light source drive shown in FIG. 3, as shown. Thus, reduction in the circuit scale is aimed at, using a signal obtained from a logical sum of the superposition signals ModO and ModU as the impedance control signal for controlling the output impedance of the light source drive with respect to the LD, in the variable resistance part 21.

According to the light source drive of this embodiment, even when a deformation of the light waveform occurs due to a combination of the above-mentioned first and second problems, the light waveform can be well shaped according to the combined functions of those of the above-mentioned first and second embodiments, a light can be made to be emitted with a desired waveform, and exact record marks can be formed Thus, according to the light source drive according to any one of the first through third embodiments of the present invention, a superposition current is provided corresponding to a charging/discharging current needed for a capacitance which occurs in parallel with the light source, during a predetermined time period at rising-up/decaying-down of a drive current of the light source. The superposition current is then added to or subtracted from the drive current appropriately. Furthermore, alternatively or in addition, the output impedance of the drive current output part is controlled also during a predetermined time period near the rising-up/decaying-down of the drive current. Thereby, a delay/rounding or ringing of rising-up/decaying-down of the light waveform can be well controlled, and a light can be made to be emitted with a desired light waveform.

Moreover, the output impedance of the drive current output part may be controlled according to the superposition signal. Thereby, a delay/rounding or ringing of rising-up/decaying-down of the light waveform can be well controlled, and a light can be made to be emitted with a desired light waveform, even with a simple configuration.

Accordingly, when this light source drive is applied to an optical information recording apparatus, formation of exact record marks can be performed.

Thus, according to the light source drive according to any one of the above-mentioned first through third embodiments of the present invention, the superposition current generation part generates the overshoot current Ios and undershoot current Ius at the rising-up and decaying-down timings of the modulation signals Mod1 and Mod2 from the modulation signal generation part. Since they are superposed and supplied to the drive-current of the light source LD, a delay (rounding) of the light waveform otherwise occurring due to the junction capacitance of the light source LD etc., can be well controlled, and a light can be made to be emitted with a desired light waveform.

Figure 10:
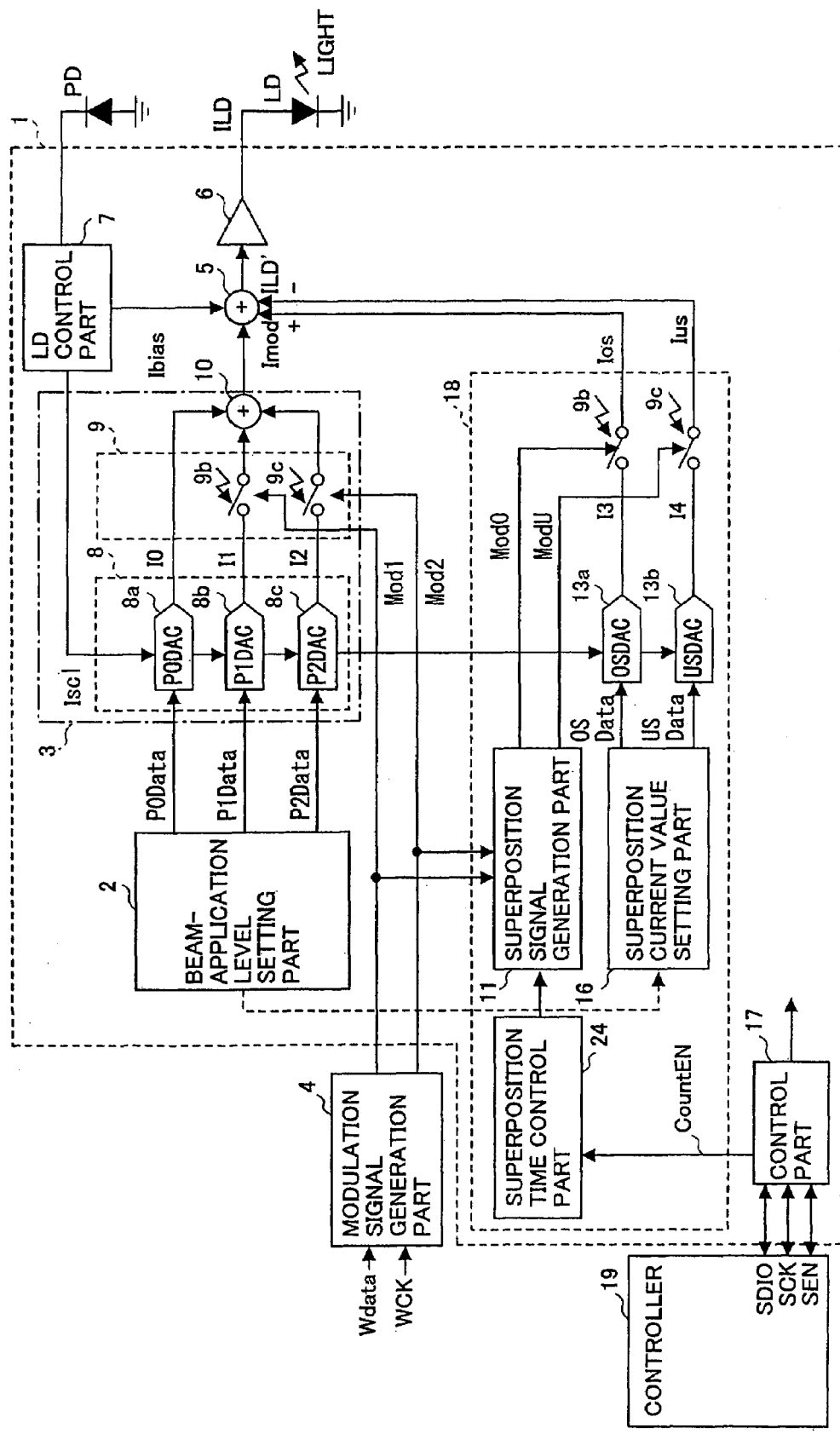
FIG. 10 shows a block diagram of a configuration of a light source drive according to a fourth embodiment of the present invention.

Next, a fourth embodiment of the present invention will now be described. FIG. 10 is a block diagram showing a configuration of a light source drive according to the fourth embodiment of the present invention. The same reference numerals are given to the same portions which are common in FIGS. 3, 5 and 9, and the duplicated description will be omitted therefor. The light source drive according to this fourth embodiment also solves the above-mentioned first problem. Each signal of the light source drive of this fourth embodiment will be described also based on FIG. 4.

Unlike the light source drive part 1 shown in FIG. 3, the light source drive part 1 shown in FIG. 10 has the modulation signal generation part 4 outside as shown. Moreover, instead of the superposition time setting part 15, a superposition time setting part 24 is provided in the superposition current generation part 18 of the light source drive part 1 shown in FIG. 3. The superposition time control part 24 controls the superposition time of the overshoot current Ios and the undershoot current Ius based on a CountEN signal of the control part 17.

As mentioned above, FIG. 4 shows a case at a time of recording to a phase-change type recording medium. In FIG. 4, a waveform (c) is a desired light waveform, and record marks of (d) are formed from application of this light waveform. Levels Pb, Pe, and Pw of the light waveform of (c) are respective beam-application levels of a bottom power level, an erase power level, and a light power level, respectively, and are beam-application levels for which the current ILD' is set to (Ibias+I0), (Ibias+I0+I1), and (Ibias+I0+I2), respectively. That is, the beam-application level is determined by the beam-application level data P0Data, P1Data, and P2Data, which set the current values I0, I1, and I2, respectively.

The modulation signals Mod1 of (e-1) and Mod2 of (e-2) in FIG. 4 are generated corresponding to the record data Wdata of (b) based on drive waveform information that indicates desired modulation timing of the light waveform beforehand set in the modulation signal generation part 4.

The superposition signal ModO of (f-1) shown in the figure is generated so as to have a light level only during the superposition time periods (To1, To2, To3) for the overshoot current according to instructions coming from the superposition time setting part 24 in synchronization with the rising-up of the modulation signal Mod1 or Mod2, in the superposition signal generation part 11. Thereby, the overshoot current Ios is generated and is added to the LD drive current.

Similarly, the superposition signal ModU of (f-2) shown in the figure is generated so as to have a high level only during the superposition time periods (Tu1) for the undershoot current according to instructions coming from the superposition time setting part 15 synchronized with the decaying-down of the modulation signal Mod2, also in the superposition signal generation part 11.

According to these modulation signals and superposition signals, the current ILD' of (g) is generated. It is noted that the drive current ILD supplied to the LD is obtained from amplifying the current ILD'.

That is, the current waveform is obtained superposed with the overshoot current Ios at the time of the rising-up of drive current, while superposed with the undershoot current Ius at the time of decaying-down of the same. The current levels I0 through I4 shown in the figure are current values generated in the current sources 8 and 13, respectively, and the current Ibias corresponds to a threshold current of the LD provided by the LD control part 7.

Figure 11:
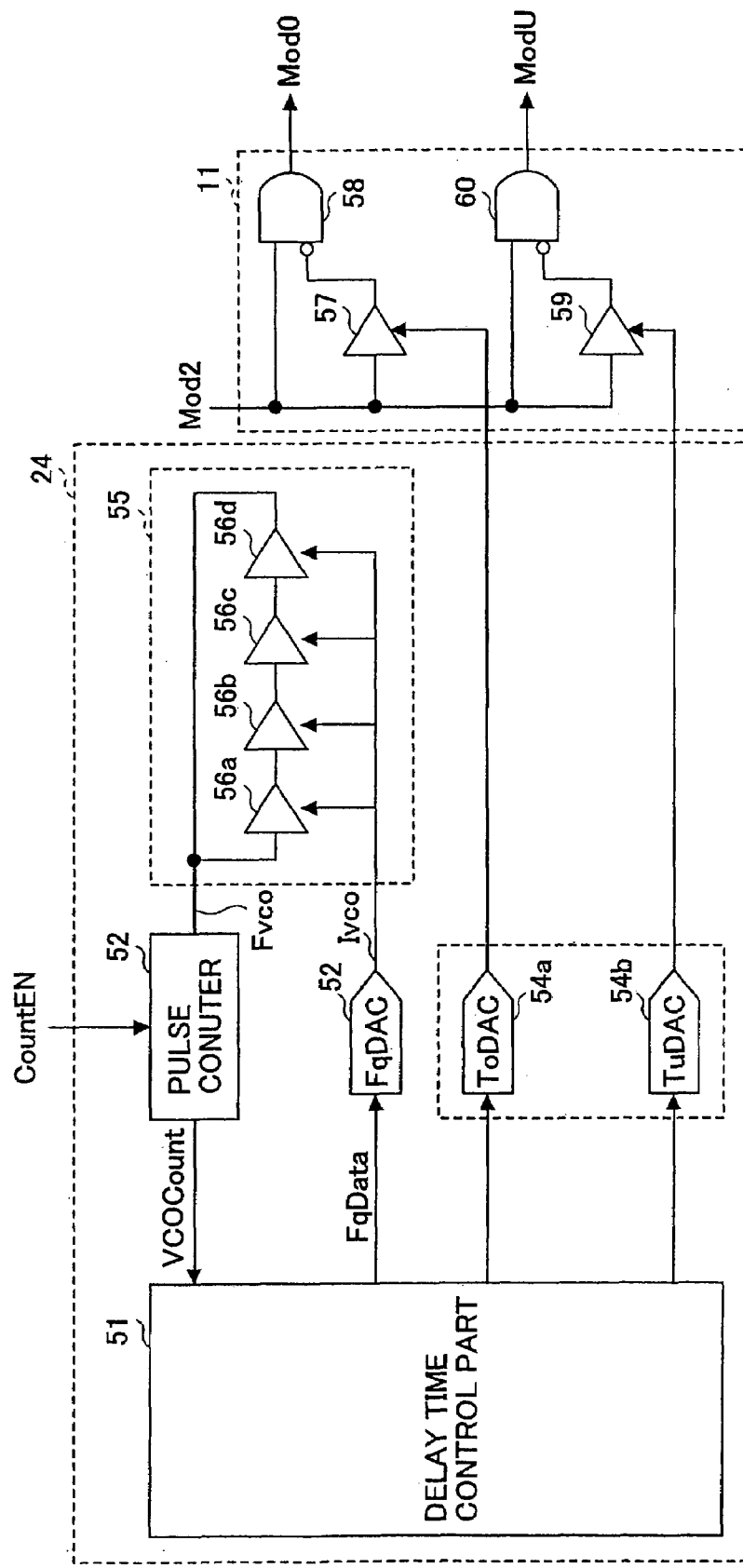
FIG. 11 shows a block diagram of detailed internal configurations of a superposition signal generation part and a superposition time control part shown in FIG. 10.
Figure 12:
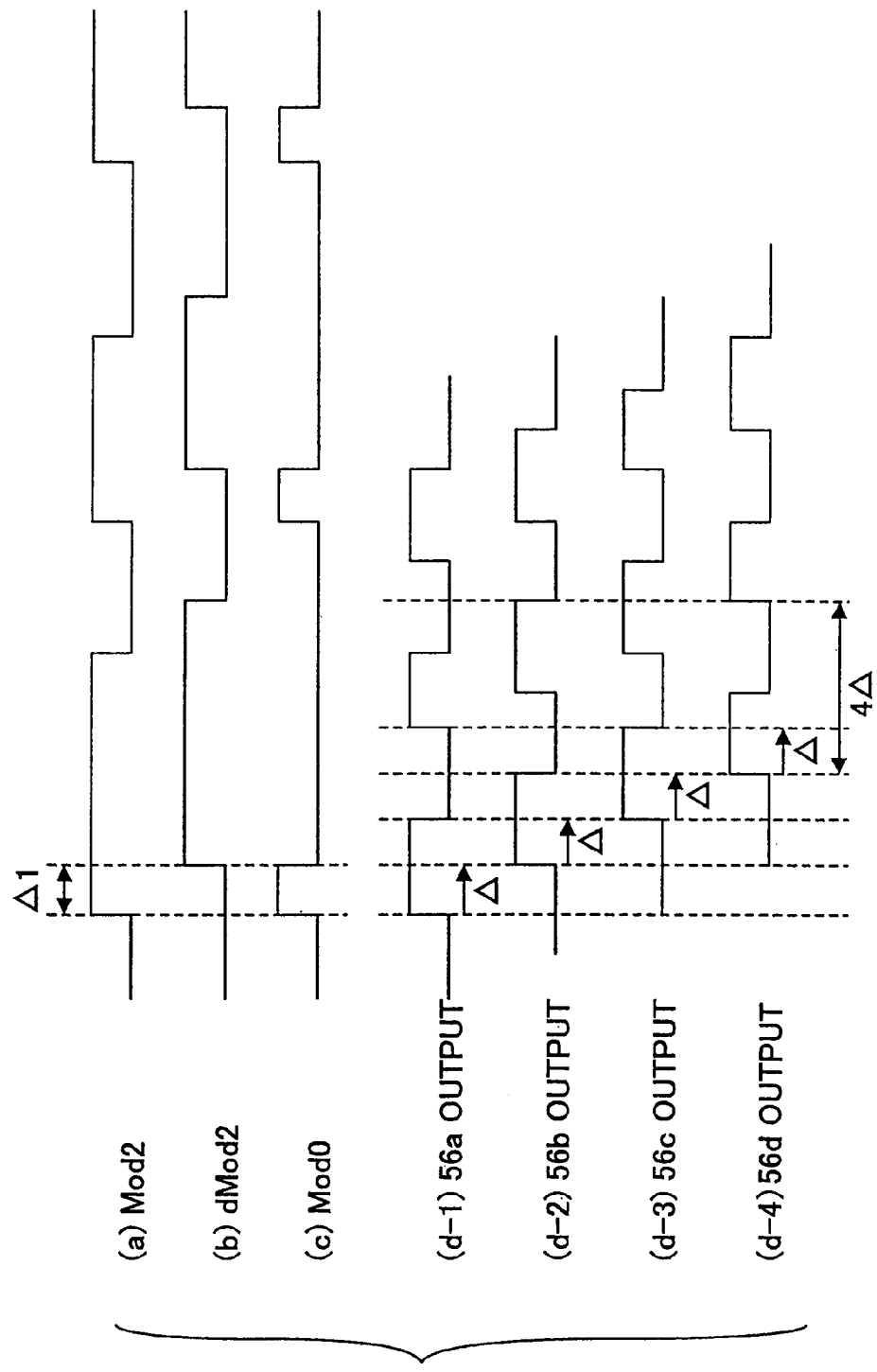
FIG. 12 shows examples of waveforms of signals occurring in the configuration shown in FIG. 11.

Next, FIG. 11 is a block diagram showing a detailed internal configuration of the superposition signal generation part 11, and the superposition time control part 24 shown in FIG. 10. Further, FIG. 12 shows an example of waveform of each signal shown in FIG. 11.

As-shown in FIG. 11, the superposition signal generation unit 11 includes a delay element 57 which has the modulation signal Mod2 input thereto, and outputs the same signal with a delay time of $\Delta 1$ which is determined by a value of a current provided thereto, and a logical circuit 58 which perform a logical operation of {Mod2&!dMod2}, where '!dMod2' means the inverted and delayed signal of Mod2, and outputs the operation result as the superposition signal ModO. Each signal is shown in FIG. 12, (a), (b) or (c). The superposition signal generation unit 11 also includes a delay element 59 which has the modulation signal Mod2 input thereto, and outputs a signal d2Mod2 delayed from the thus-input signal Mod2 with a delay time of $\Delta 2$, and a logical circuit 60 which performs a logical operation of {!Mod2&d2Mod2}, where '!Mod2' means the inverted signal of Mod2, and outputs the operation result as the superposition signal ModU.

The above-mentioned example shows a configuration in which the superposition signal ModO is generated in synchronization with the rising-up of the modulation signal Mod2. However, it is also possible that the superposition signal is generated also at the time of the rising-up of the modulation signal Mod1. Moreover, it is possible to connect a plurality of delay elements in series for the delay element 57 or 59.

The superposition time control part 24 includes delay elements 56a through 56d each having the same characteristic as each of the delay elements 57 and 59 (that is, the relation of the delay time with respect to the current supplied thereto is common thereamong) which form a ring oscillator 55 (in order to simplify the description, FIG. 11 shows a configuration thereof with only four stages of delay elements), a current source FqDAC 53 which supplies a current set by an FqData signal to these delay elements 56a through 56d, a pulse counter 52 which measures the oscillation frequency of the oscillator 55, a delay time control part 51 which controls the FqData signal so that the oscillation frequency measured by the pulse counter 52 becomes a predetermined frequency, and current sources ToDAC 54a and TuDAC 54b which supply the current values set by the delay time control part 51 to the delay elements 57 and 59, respectively.

In FIG. 12, curves (d-1) through (d-4) show waveforms of the output signals of the delay elements 56a through 56d, and the curve (d-4) shows the output signal waveform of the oscillator 55.

The current by which the delay time is set to a is supplied to each of the delay elements 56a through 56d, and thus, the oscillation frequency Fvco of the oscillator 55 is set as $1/(4\Delta)$.

Therefore, when the output current of the current source FqDAC 53 is controlled appropriately so that the oscillation frequency is set to a predetermined $1/(4\Delta 1)$, and the same current is made to be supplied from the current source ToDAC 54a, the superposition signal ModO with the superposition time width of $\Delta 1$ can be generated.

Similarly, when the output current of the current source FqDAC 53 is controlled appropriately so that the oscillation frequency is set to a predetermined $1/(4\Delta 2)$, and the same current is made to be supplied from the current source ToDAC 54b, the superposition signal ModU with the superposition time width of $\Delta 2$ can be generated.

Next, control processing for the above-mentioned delay time, i.e., control processing for the oscillation frequency will now be described. The oscillator 55 is an oscillator which has the frequency setting current Ivco provided thereto which the current source FqDAC 53 outputs, and is thus made to generate the signal of frequency Fvco. This function is the same as that of a well-known VCO (Voltage Controlled Oscillator)

Figure 13:
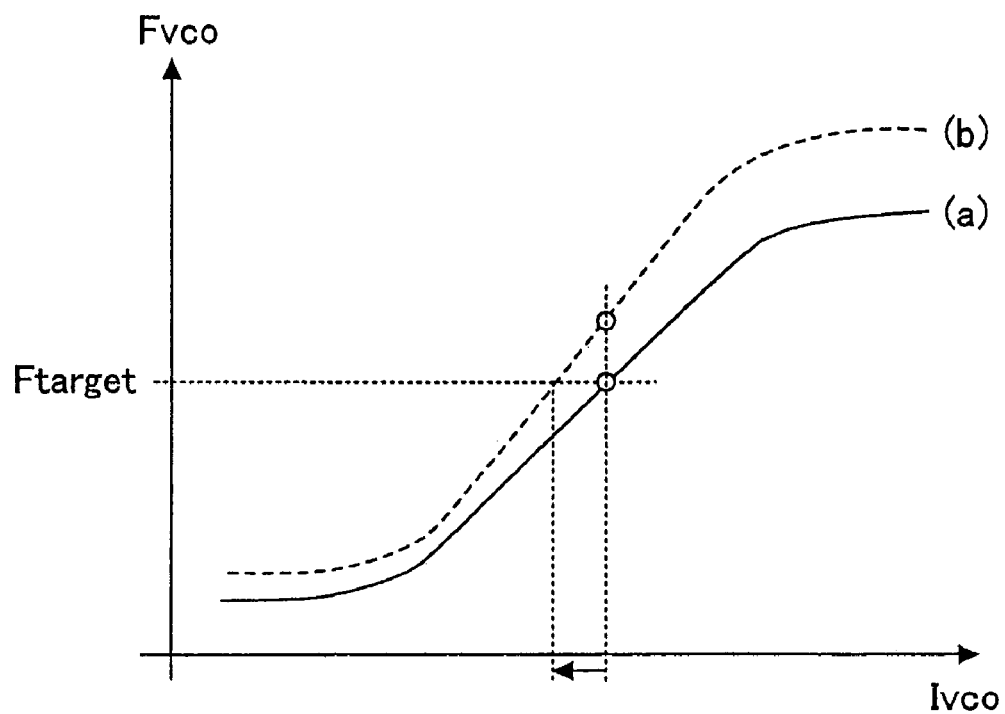
FIG. 13 shows an example of a characteristic of an oscillation frequency with respect to a frequency setting current in an oscillator shown in FIG. 11.

FIG. 13 shows an example of a characteristic of the oscillation frequency Fvco with respect to the above-mentioned frequency setting current Ivco. According to a variation in devices etc., the characteristic varies in a usual VCO, as shown in curves (a) and (b) in FIG. 13. That is, even when a predetermined frequency setting current Ivco is provided, a desired frequency Ftarget may not be obtained very accurately. However, according to the light source drive in the fourth embodiment of the present invention described above, it is controllable by the control processing described below into a desired frequency Ftarget very accurately with a simple scheme.

The pulse counter 52 counts the number of output pulses of the oscillator 55 during a predetermined frequency measurement time Tcount indicated by the CountEN signal supplied from the control part 17 (the pulse measurement result therefrom is assumed as a VCOCount). Therefrom, the oscillation frequency Fvco of the oscillator 55 is detectable with operation processing based on a formula (1).

$$Fvco = VCOCount/Tcount \quad (1)$$

The delay time control part 51 performs a control such as to change the data FqData to be set to the current source FqDAC 53 so that it may become the predetermined value Ftarget based on the pulse measurement result VCOCount.

The delay time control part 51 may be provided, for example, in the controller 19. In this case, transfer of the pulse measurement result VCOCount and Data FqData should be made via the control part 17.

Figure 14:
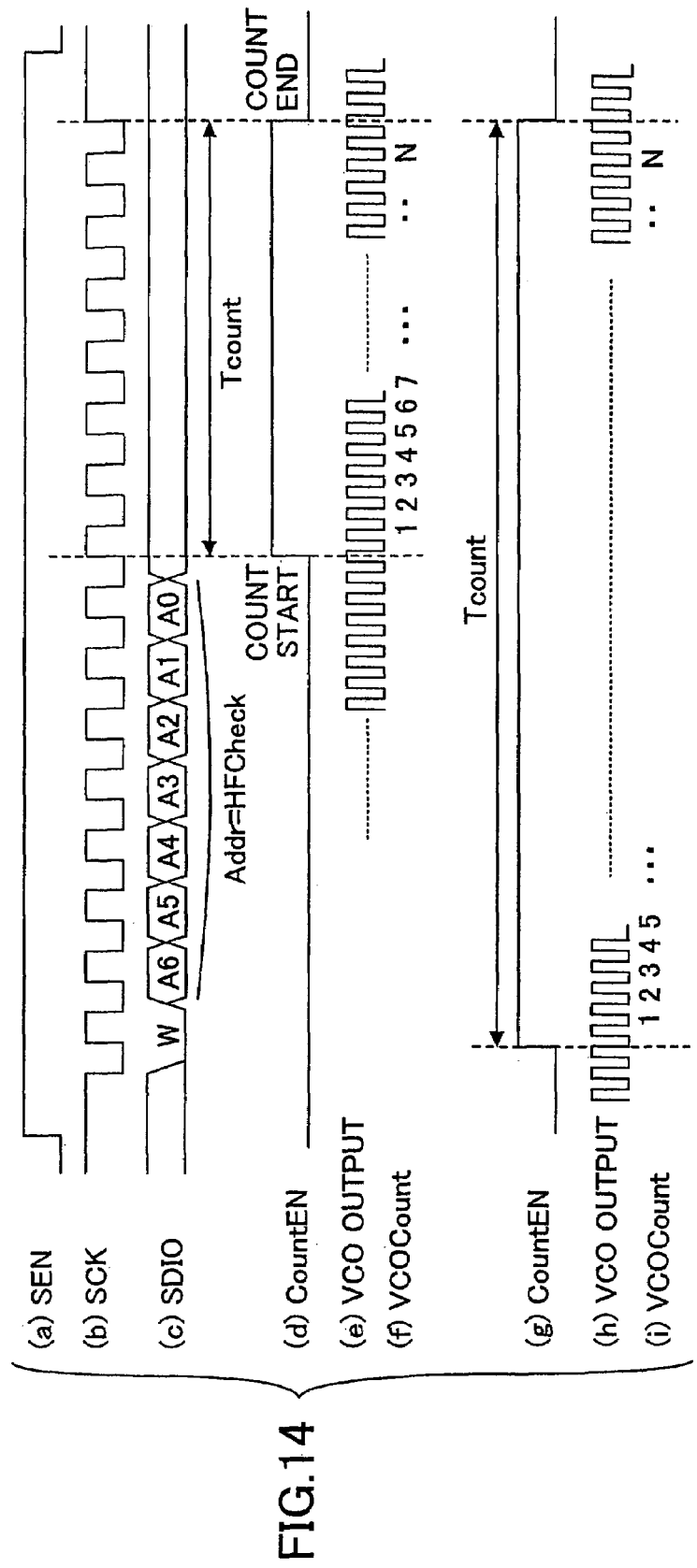
FIG. 14 shows examples of waveforms of signals for illustrating a processing for a measurement of an oscillation frequency of the oscillator shown in FIG. 11.

FIG. 14 shows signal waveforms for illustrating the processing of measuring the above-mentioned oscillation frequency, and shows signals of essential parts shown in FIGS. 10 and 11.

Each signal of (a) SEN, (b) SCK, and (c) SDIO shown performs communications between the controller 19 and the control part 17. The (a) SEN indicates an enable state of communications, the (b) SCK performs clock supply, and the (c) SDIO indicates address data. The clock frequency of SCK of (b) is supplied with a predetermined frequency fsck (the period is set to Tsck).

The signal SDIO of (c) is sent/received in synchronization with the SCK signal. The former 8 bits of this signal SDIO indicates an address (the first 1 bit thereof indicates read/write), while the latter 8 bits thereof indicates data to be communicated. In case the oscillation frequency in the VCO is measured, a write access to a predetermined address (HFCheck) is performed, the control part 17 responds thereto so as to indicates the period (for which the data is transferred) by causing the signal CountEN to have a high level as shown in FIG. 14, (d). In response thereto, the pulse counter 52 counts the pulses of the output of the VCO (oscillator output) shown in FIG. 14, (e) during this period (FIG. 14, (f) shows the count value VCOCount). During the period in which the signal CountEN shown in FIG. 14, (d) has a low level, no such a counting is performed, and the count value is then held. Thereby, the measurement of the frequency of the output of the oscillator 55 (VCO) is made positively, is utilized for the above-mentioned control such that the frequency is controlled into the target value.

Thereby, even when the characteristic of the oscillation frequency Fvco with respect to the frequency setting current Ivco of the VCO varies as shown in FIG. 13, (a) and (b), due to a variation in device product, etc., it becomes possible to achieve a control with the very simple configuration to obtain the desired oscillation frequency Ftarget at high accuracy.

Therefore, the superposition signal ModO produced using the delay elements with the same characteristic as in the oscillator 55 can be controlled at the desired superposition time Δ1 accurately. A similar control should then be performed so that the desired superposition time Δ2 is obtained accurately.

Such a time control may be performed always, or may be performed only when the machine is started up, or in another appropriate timing.

The overshoot current Ios and the undershoot current Ius thus generated and superposed are used as charging/discharging currents for the junction capacitance of the LD. Accordingly, a delay of the rising-up/decaying-down timing or rounding of the light waveform can be avoided. Accordingly, a light can be made to be emitted with a desired light waveform from the LD, and thus, exact record marks can be formed on the optical recording medium.

Further, even when a variation occurs in particular device product, appropriate control can be achieved without increasing the number of signal wires used for signal transmission. Accordingly, the present invention in this embodiment is advantageous for miniaturizing/price reduction of the apparatus.

Further, according to the present invention, as shown in FIG. 10, the superposition signal generation part 11 is provided in common within the IC chip of the LD driver 1. Accordingly, it is not necessary to provided external wiring between the superposition signal generation part 11 and the LD driver 1, also, extra external terminal contacts therefor are not needed in this IC chip. Thus, miniaturization and cost reduction in the apparatus may be archived effectively.

The above-mentioned junction capacitance may differ according to a particular product of the LD applied. Accordingly, it is preferable that the above-mentioned superposition current values should be preferably adjusted accordingly. Thereby, appropriate charging/.discharging of the junction capacitance of the LD can be achieved, thus, a still more ideal light waveform can be provided, and a more excellent record mark formation can be performed. In the light source drive according to the fourth embodiment of the present invention, the superposition current value setting part 16 executes this function. The same effect is acquired by adjusting the superposition time of overshoot current Ios and undershoot current Ius, instead. In the light source drive of the fourth embodiment, the superposition time setting part 15 executes this function. It is also possible to combine these functions.

Furthermore, it is further preferable to adjust the current values and/or the superposition times of the overshoot current Ios and the undershoot current Ius according to change in the beam-application levels. That is, according to changes in the beam-application level, i.e., Pe→Pw, Pb→Pw, Pb→Pe), the amount of change in the potential across the cathode and anode of the LD differs, and thus, the charging/discharging current needed changes accordingly. Therefore, when the superposition times (To1, To2, To3) are controlled according to the thus changing beam-application level shift, the rising-up/delaying-down timing or rounding of the light waveform can be controlled more finely. The same effect can be acquired by controlling the current values.

Moreover, by configuring such that the pulse count result VCOCount shown in FIG. 11 is held at the maximum value in case the pulse counter overflows, an erroneous control can be avoided. Furthermore, a configuration may be made such that the pulse counter 52 shown in FIG. 11 measures an 1/N frequency divided signal of the oscillator output. Thereby, the pulse counter should not be operated at high speed.

The form of communications made between the controller 19 and the control part 17 described above with reference to FIGS. 10 and 14 is merely one example. Even when another form of communications is applied, it is possible to achieve a similarly measurement by using the transfer clock signal.

Moreover, it is also possible instead that the signal of CountEN is produced shown in FIG. 14, (g) instead of that shown in FIG. 14, (*d*), and the counting is performed through a normal accessing occasion. Then, upon a write access to the predetermined address (HFCheck) is made, the VCO pulse measurement result of VCOCount shown in FIG. 14, (*i*) may be held. Thereby, it becomes possible to elongate the measurement time period Tcount, and, thus, it becomes possible to achieve more precise oscillation frequency detection.

Alternatively, it is also possible that the CountEN signal shown in FIG. 14, (*g*) is produced for an access which is made subsequently to the write access to the predetermined address (HFCheck).

Moreover, an SCK frequency setting part which sets the frequency of the SCK signal may be provided in the controller 19, and, thereby, the frequency of the SCK signal may be changed so that the frequency measurement time Tcount may be changed accordingly, appropriately.

Thereby, it becomes possible to elongate the measurement time Tcount within a range in which the pulse counter 52 does not overflow. Accordingly, it becomes possible to increase the accuracy of the measurement effectively.

Then, during a normal communication occasion, the SCK clock frequency may be made higher so that high-rate transfer is achieved, while, at a time of the superposition frequency measurement, the SCK clock frequency may be lowered so that the accuracy of the measurement is improved.

In addition, in order to reduce LD noise by a reflected light from a disk to the optical disk drive, usually, a method, called 'high frequency superposition', of superposing a high frequency signal on a drive current for the LD may be taken in some cases. In such a case, since it is a common way to use an oscillator (VCO), and, therefore, this oscillator may be used in common also as the above-mentioned oscillator 55.

Figure 15:
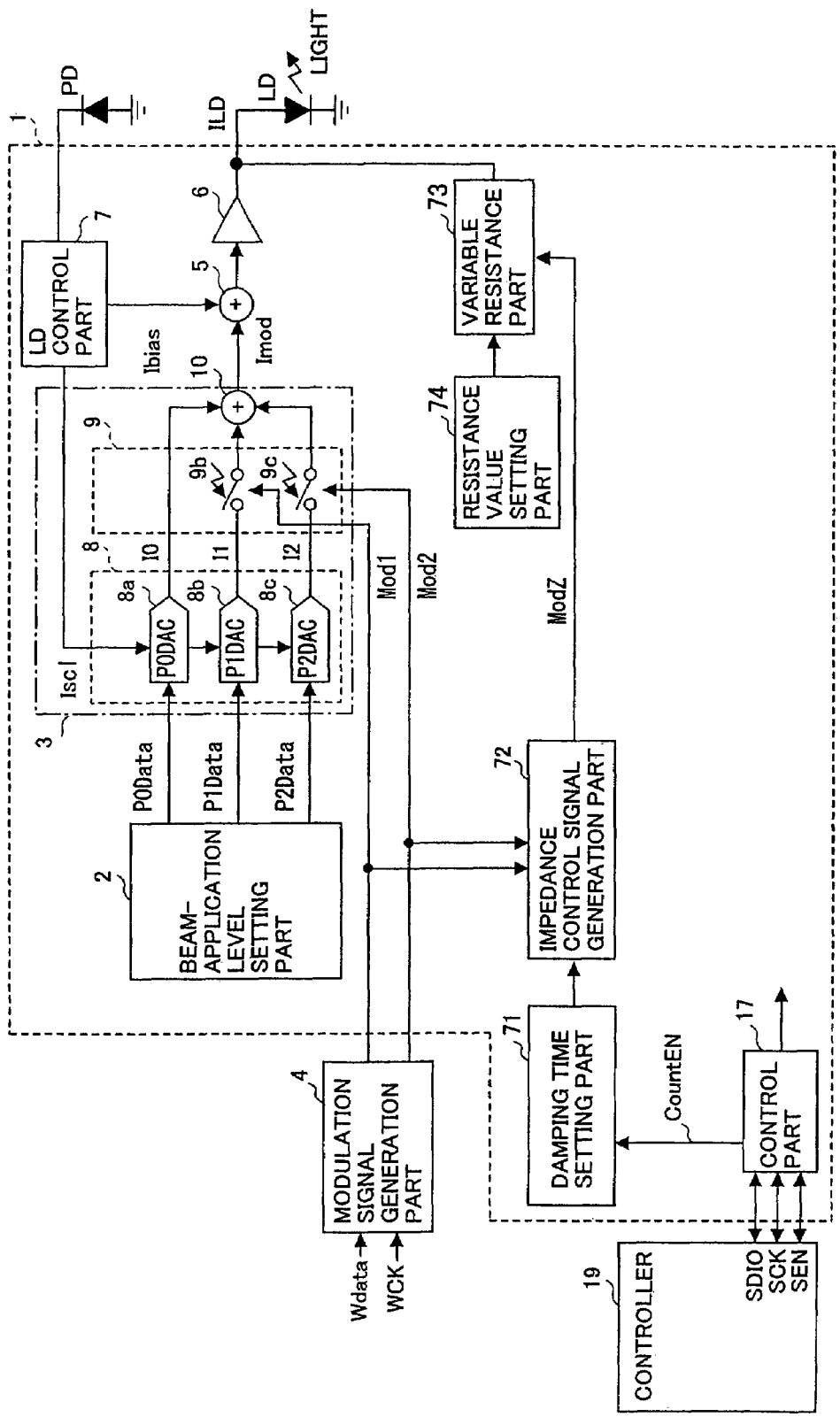
FIG. 15 shows a block diagram of a configuration of a light source drive according to a fifth embodiment of the present invention.

FIG. 15 shows a block diagram showing a configuration of a light source drive according to a fifth embodiment of the present invention. The light source drive of this embodiment solves the above-mentioned second problem. Each block having the same reference numeral as that shown in FIGS. 3, 5, 9 and 10 performs the same operation and function as described, and, thus detailed description thereof will be omitted therefor.

As shown in FIG. 15, in parallel with a current source which provides the output current of the current drive part 6, a variable resistance part 73 is connected which controls the output impedance of the light source drive part 1. According to an impedance control signal ModZ, this variable resistance part 73 has a resistance Rd according to a resistance value setting signal Svr when the ModZ=High (high level), while this has an approximately infinite resistance when the ModZ=Low (low level).

A resistance setting part 74 generates the resistance setting signal Svr which indicates a resistance for a case where the lower impedance is provided by the variable resistance part 73 as mentioned above.

An impedance control signal generation part 72 starts up in synchronization with the modulation timing (which corresponds to the rising-up or decaying-down timing of the modulation signals Mod1 and Mod2, or a part thereof) supplied from the modulation signal generation part 4, and generates the impedance control signal ModZ having a high level only during a period set by a dumping time setting part 71. These parts 71 through 74 execute a function of controlling the output impedance.

Figure 16:
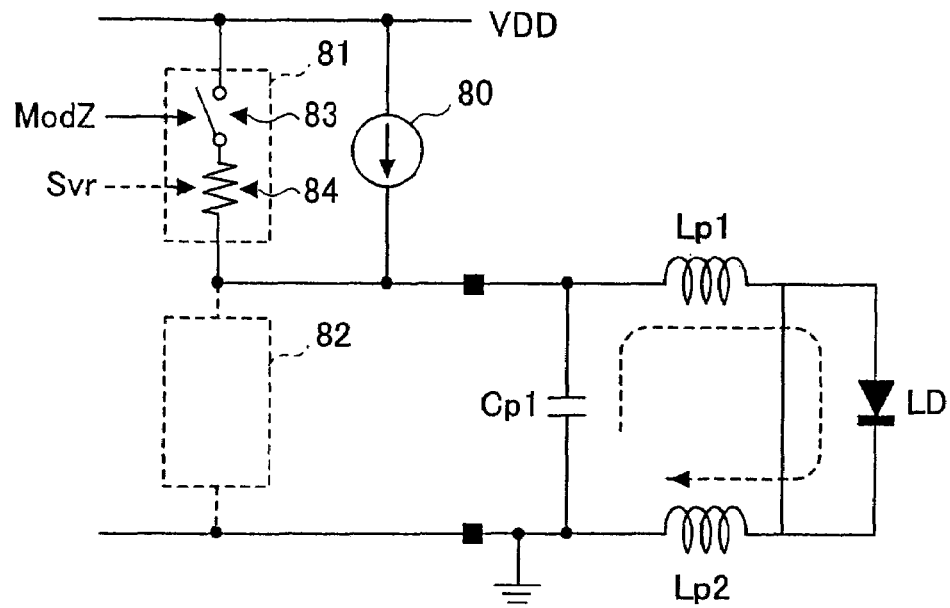
FIG. 16 illustrates an operation for controlling a ringing of a light waveform otherwise occurring due to a parasitic inductance, which is the second problem to be solved.

FIG. 16 shows a circuit diagram for illustrating control operation of a function of controlling a ringing of a light waveform occurring due to a parasitic inductance, which is the above-mentioned second problem.

A ringing of the light waveform occurs due to a resonance occurring in a loop indicated by a broken arrow shown in FIG. 16. What is necessary is just to connect a resistance component to this loop in parallel, in order to control this resonance. The resistance component should just be connected at a time of the rising-up/decaying-down of the drive current at which ringing would otherwise occur. The current source 80 shown in FIG. 16 corresponds to a current source at an output stage which supplies an output current of the current drive part 6 shown in FIG. 15.

A variable resistance part 81 shown in FIG. 16 achieves this function, and the variable resistance part 73 shown in FIG. 15 corresponds thereto. This includes a switch 83 and a resistor 84, and on-off control is carried out by the switch according to the impedance control signal ModZ. In case the resistor 84 is made of a variable resistor for which the resistance thereof is set by the resistance setting signal Svr, and the resistance is set according to the transmission circuit characteristic between the light source drive part 1 and the LD, ringing can be controlled more appropriately and a light can be made to be emitted by the LD with a desired light waveform.

Moreover, as the power supply VDD and the ground are short-circuited in terms of AC operation, the variable resistance part 82 may be connected as shown in FIG. 16.

Figure 17:
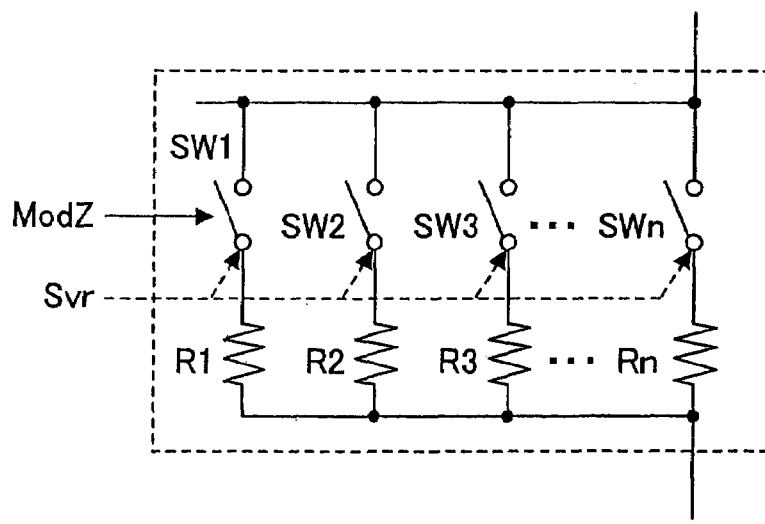
FIG. 17 shows another internal configuration of a variable resistance part shown in FIG. 15.

FIG. 17 shows another example of the variable resistance part 73 shown in FIG. 15. This variable resistance part has a parallel connection of resistors R1 through Rn with switches SW1 through SWn connected in series, respectively. One of the switch is selected according to the resistance setting signal Svr, while an on-off control is performed on the thus-selected switch according to the impedance control signal ModZ. According to the thus-configured variable resistance part, it becomes possible to effectively control ringing in response to the transmission circuit characteristic with a simple configuration.

Although not shown, details of the impendence control signal generation part 72 and dumping time control part 71 may be the same as those shown in FIG. 11.

According to the present embodiment, in comparison to the above-mentioned scheme of controlling ringing with the snubber circuit in the related art, the light source drive is suitable to be integrated with a CMOS process, and also, even when a ringing mode varies due to a variation of the transmission circuit characteristic or characteristic of the pickup device, the ringing otherwise occurring thereby can be well controlled through an appropriate setting of the resistance value.

Further, the time interval during which the dumpling resistance should be switched on can be set properly. Furthermore, even when the devices have variations, a proper control can be achieved. Also, a simple configuration can do well, and the proper control is achieved without increase of the number of transmission lines. Accordingly, the present embodiment is advantageous for miniaturizing/cost reduction of the light-source drive.

Figure 18:
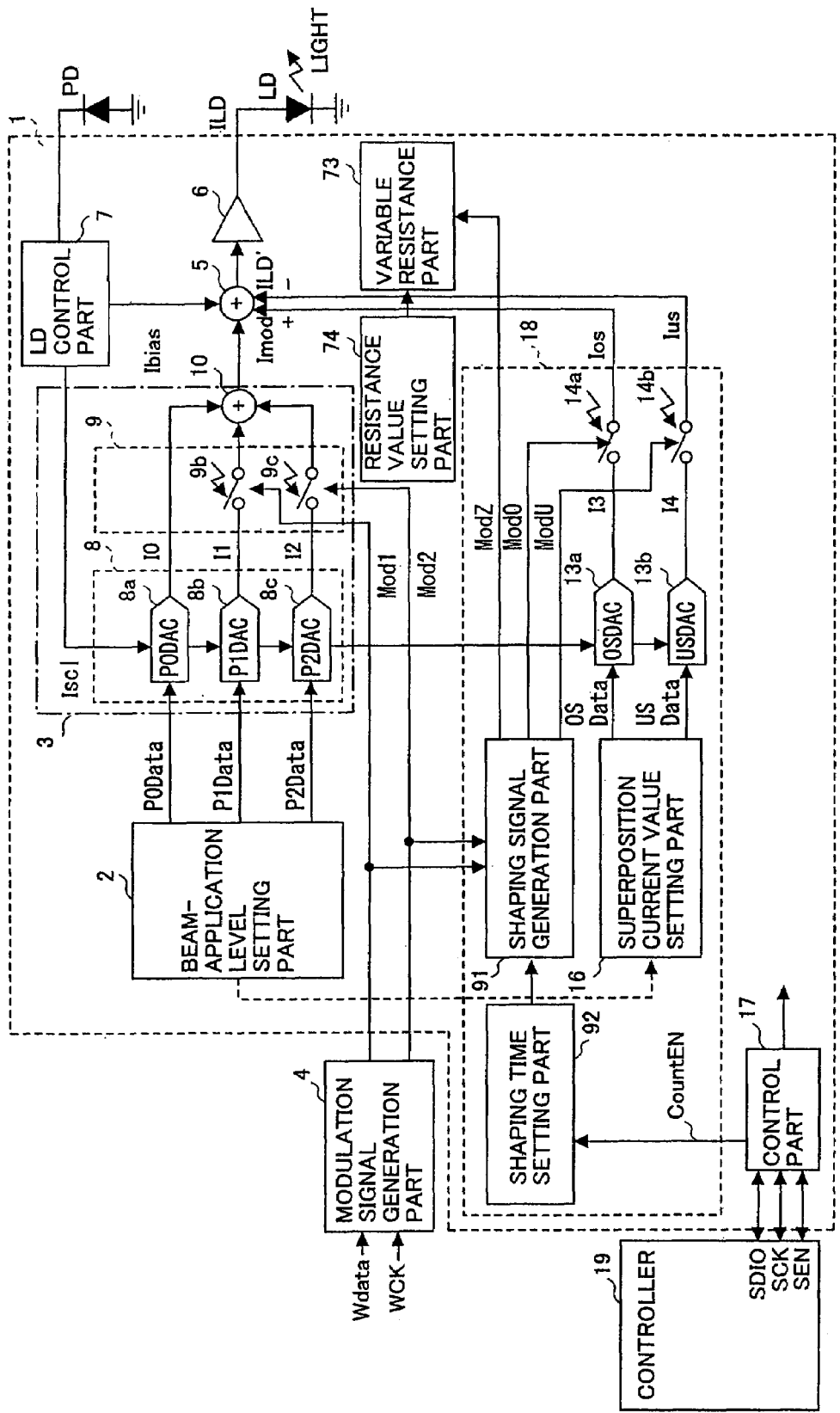
FIG. 18 shows a configuration of a light source drive according to a sixth embodiment of the present invention.

Next, a sixth embodiment of the present invention will now be described. FIG. 18 is a block diagram showing a configuration of a light source drive according to the sixth embodiment of the present invention. The same reference numerals are given to parts same as those shown in FIGS. 3, 5, 9, 10 and 15, and duplicated descriptions will be omitted. The light source drive according to the sixth embodiment solves the above-mentioned first and the second problems.

As shown in FIG. 18, a shaping signal generation part 91 and a shaping time control part 92 generate the superposition signals ModO and ModU and the impedance control signal ModZ as in the above-mentioned embodiments. A detailed configuration thereof may be same as that shown in FIG. 11.

According to the light source drive in this sixth embodiment, it is possible to shape a light waveform of laser beam so as to cope with a deformation in waveform which would otherwise occur due to a cause in combination of the above-mentioned first and second problems. Thereby, a light beam can be made to be emitted by the LD with a desired waveform, and formation of an exact record mark can be archived on the optical disk.

Thus, according to the above-mentioned fourth through sixth embodiments of the present invention, a deformation of light waveform resulting from parasitic devices such as capacitances, inductances or so produced in transmission wires installed toward the light source or the light source itself can be corrected. Accordingly, a deformation in waveform of light beam (such as a delay or rounding in a rising-up/decaying-down, or ringing) can be well reduced, and, thus, light beam emission can be performed with a desired waveform.

Furthermore, as superposition current is produced and is appropriated as a current necessary for charging/discharging a junction capacitance or so of the light source, a delay or rounding of rising-up/decaying-down in the light waveform occurring due to the capacitance can be well reduced. Thus, light beam emission can be performed with a desired waveform.

Furthermore, as the superposition current can be applied at a proper timing, a possible excessive overshooting can also be positively avoided.

Furthermore, as the output impedance of the drive current output can be controlled during a period near at least one of a rising-up and a decaying-down of the drive current for the light source, this functions to well control a resonance otherwise occurring due to the parasitic impedance or so occurring in the transmission wires installed toward the light source, and, thus, well control ring/overshooting in the light waveform so that the light beam is emitted with a desired waveform.

Furthermore, a delay or rounding of rising-up/decaying-down of light waveform, or ringing can be well controlled, and a light beam (laser beam) can be emitted with a desired waveform.

Furthermore, a timing at which a waveform shaping should be performed can be properly determined.

Furthermore, as the time period for which the frequency detection is performed can be elongated as mentioned above, the frequency detection can be achieved with a high accuracy, and, thereby, as mentioned above, the waveform shaping can be performed more accurately.

Furthermore, when any of the present embodiments of the present invention is applied to an optical information recording apparatus, an accurate record mark can be formed on an optical recording medium such as an optical disk. Further, even there are variations in performance of device products employed in the apparatus, a proper and simple configuration can achieve an excellent control of light waveform, without increase in the number of transmission wires. Accordingly, the apparatus can be effectively miniaturized or reduced in the costs.

A seventh embodiment of the present invention will now be described.

As described above, in a pigment-system write-once-type optical disk such as a CD-R, DVD+R disk, or so, a record mark is formed by producing an optical change by a thermal decomposition thanks to a light beam application or to a substrate deformation occurring therewith. Therefore, in order to form a proper mark shape or to control a mark formation position accurately, a proper light waveform should be produced. A similar situation occurs also on a magneto-optical recording medium such as an MO, MD or so, in which magnetism inversion near the Curie point is utilized.

Specifically, in each of these recording media, the recording medium is increased in temperature by application of a laser beam to a recording layer thereof, whereby physical or chemical transformation occurs there and thus optical recording is achieved. Accordingly, it is important to properly control a beam application energy applied onto the recording medium, i.e., a beam application power and a beam application time duration.

In recording methods for various types of optical disks, such as a CD, a DVD, and so forth, a mark edge recording method which is-suitable for high-density recording, is employed, in which information is recorded according to a mark length formed. In this method, to control a mark shape and to control an edge position of the mark is essential.

Further, as it is necessary to well control a mark shape uniformly among various mark lengths, a multi-pulse recording method is widely employed in which a plurality of separate recording pulses are used for forming a long mark.

Specifically, a uniform long mark is formed by repeating a cycle of heating and cooling, and connecting respective marks formed therefrom into the continuous long mark. Such a recording method is applied also for the above-mentioned pigment-system write-once-type recording medium. Hereinafter, a pulse used for an application of a laser beam with a high power so as to increase the recording medium in temperature will be referred to as a heating pulse, while a pulse for an application of a laser beam with a low power so as to prevent the recording medium from being increased in temperature or to rapidly cool the same will be referred to as a cooling pulse.

For the above-mentioned reason, conventionally, the time-axis resolution should be increased in an application of laser beam so as to perform the mark positional control for high-speed recording. For example, Japanese laid-open patent application No. 8-287465 discloses a method for appropriately correcting an application time duration as well as a cooling time duration because both an accuracy of a beam application energy and an accuracy of a cooling time are important especially for a phase-change recording medium in an optical information recording apparatus.

Highspeed optical modulation is demanded for highspeed optical recording recently. In order to increase the rate at which information is recorded while the recording quality is maintained, it is necessary to increase the time-axis resolution of application time and cooling time for laser beam application onto the optical disk. For example, conventionally, for achieving ten-time recording of DVD, a time-axis resolution as high as approximately 100 ps is needed.

However, according to a conventional optical information recording apparatus, there is a problem of difficulty in achieving such a high-speed recording, or needing a considerable cost rise.

Moreover, as will be described, proper heating and cooling may not be achieved, as a delay or rounding of a rising-up/decaying-down of light waveform occurs together with increase in the recording speed. Thereby, the mark shape or mark position may not be controlled at high accuracy.

Figure 19:
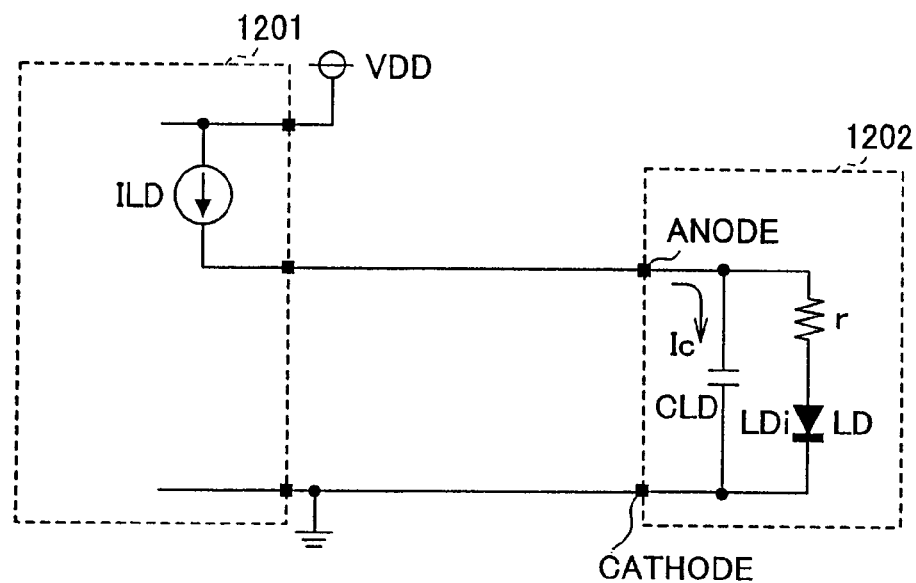
FIG. 19 illustrates a problem occurring in a case of driving an LD with a conventional light source drive.

FIG. 19 shows a circuit diagram of a configuration for driving an LD (laser diode) in a light source driver for the purpose of illustrating the above-mentioned problem. It is noted that an LD drive part 1201 omits illustration except a current source which supplies a drive current. Moreover, FIG.

20 shows light waveforms in an example of laser beam emitted from the LD by the circuit shown in FIG. 19.

The LD usually has a junction capacitance between the anode and cathode (in addition, parasitic capacitance also may occur there). The circuit shown in FIG. 19 includes a simple LD equivalent model 1202 in consideration of this junction capacitance. As shown, this equivalent model includes the junction capacitance CLD also including the parasitic capacitance, an turned-on resistance 'r' and an ideal LD 'LDi'.

Figure 20:
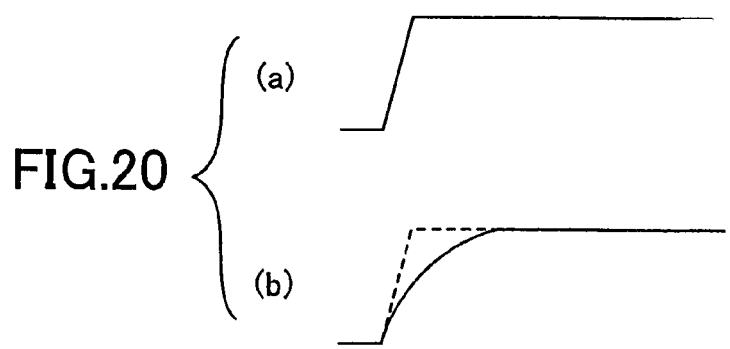
FIG. 20 shows light waveforms in an example when an LD is driven with the light source drive shown in FIG. 19.

Due to this junction capacitance, even when a predetermined drive current ILD with a sharp rising-up and a sharp decaying-down as shown in FIG. 20, (a), is applied, an actual current flowing through the ideal LD, LDi has a delay or rounding of the rising-up/decaying-down as shown in FIG. 20, (b). This is because a partial current Ic is consumed for charging/discharging the junction capacitance CLD, and, thus, the current to actually flow through the ideal LD, LDi is changed during the charging/discharging operation. As a result, the delay occurs in the rising-up/decaying-down in the waveform as shown in FIG. 20, (b). As a result, the LD emits a laser beam with a waveform shown in the solid curve of FIG. 20, (b), which is different and deteriorated from the desired waveform indicated by the broken curve in the same figure.

When the accuracy in mark shape or mark position is thus degraded, data error may occur accordingly in information recording onto the optical disk. Especially, an LD with a high power is needed for achieving high-speed recording, such an LD having a high power has a large junction capacitance accordingly in general, and, also, a high-speed or sharp rising-up/decaying-down is needed. In such a case, this type of problem becomes remarkably worse accordingly.

The seventh embodiment of the present invention solves this problem, and aims at forming an exact record mark without actually improving the time-axis resolution for beam-application time and cooling time also in the case of performing high-speed recording. Moreover, as in the above-mentioned embodiments of the present invention, the seventh embodiment also has a purpose to control or well reduce a delay or rounding of rising-up/decaying-down in a light waveform which would otherwise occur due to the junction capacitance of the LD, etc., so as to enable beam emission with a desired waveform whereby a record mark is formed properly at high accuracy.

Figure 21:
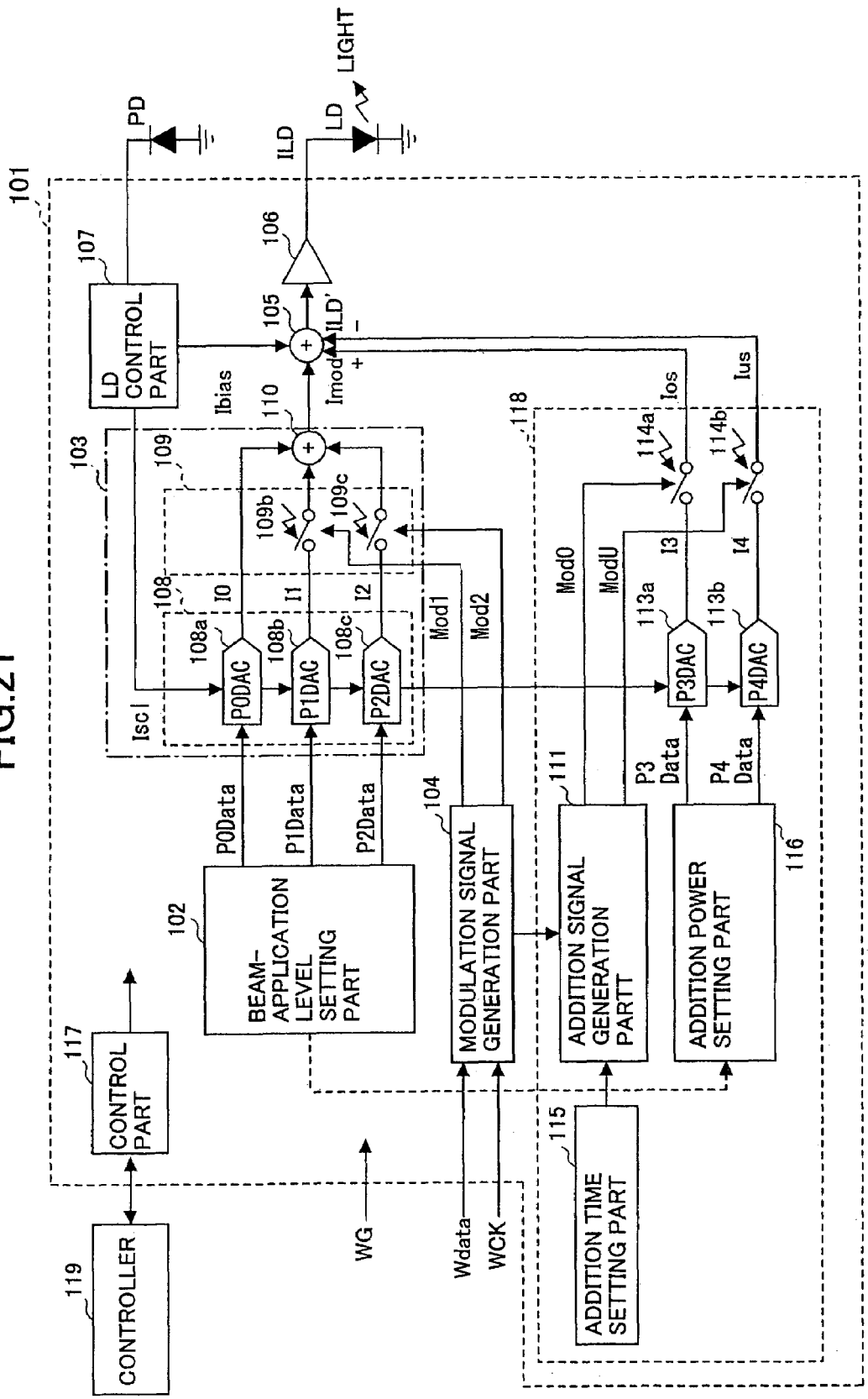
FIG. 21 shows a block diagram of a configuration of a light source drive of an optical information recording apparatus according to a seventh embodiment of the present invention.
Figure 22:
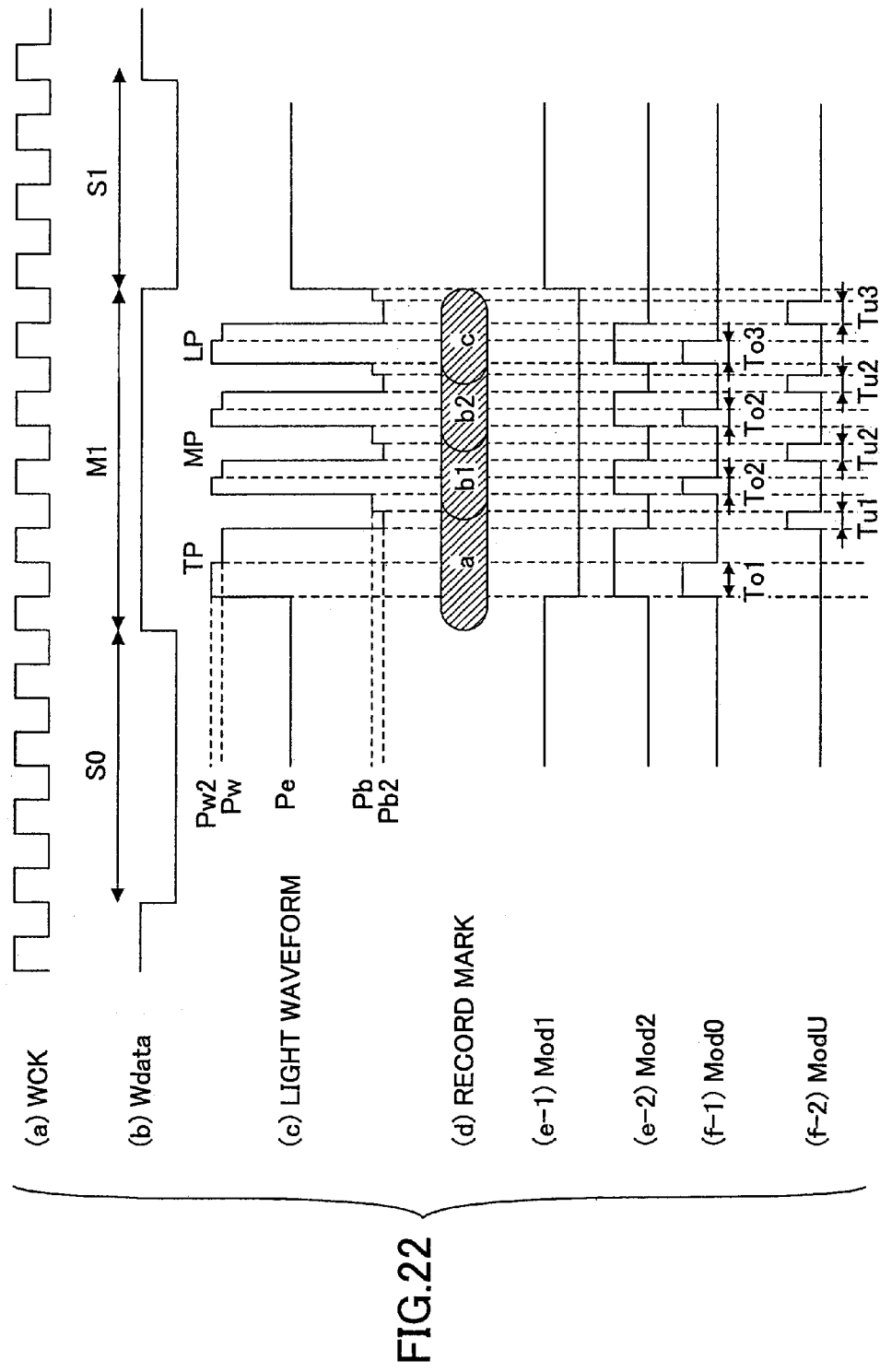
FIG. 22 shows waveforms of signals occurring in the light source drive according to the seventh embodiment of the present invention.

FIG. 21 shows a block diagram of a main configuration of an optical information recording apparatus in the seventh embodiment of the present invention. FIG. 22 shows waveforms of signals of respective parts of the optical information recording apparatus shown in FIG. 21. This optical information recording apparatus is an optical disk drive, such as a CD-R drive, a CD-RW drive, a DVD-R drive, a DVD-RW drive, a DVD+RW drive, a DVD-RAM drive, or so.

In FIG. 21, a light source drive part 101 includes a beam-application level setting part 102 which outputs respective data, i.e., P0Data, P1Data and P2Data, which sets beam-application levels of an LD, i.e., P0, P1, and P2. A modification signal generation part 104 also included in the light source drive 101 generates and outputs modification signals Mod1 and Mod2 for the LD from a record data signal Wdata and a record clock signal WCK.

A modification part 103 also included in the light source drive 101 generates and outputs an LD modification current Imod based on the beam-application level data P0Data, P1Data and P2Data corresponding to the respective beam-application levels of P0, P1, and P2 of the LD and the modification signals Mod1 and Mod2. An addition current generation part 118 also included in the light source drive 101 generates an overshoot current Ios and an undershoot current Ius which superpose an addition power to the heating pulse and an addition power to the cooling pulse, respectively (referred to as addition currents Ios and Ius, respectively, hereinafter), based on modulation timings (which correspond to rising-up or decaying-down timings of the modulation signals Mod1 and Mod2, or to their parts) which the modulation signal generation part 104 generates.

An LD control part 107 controls a bias current Ibias and a scale signal Iscl which indicates a scale of a modulation current so that a light emission amount of the LD becomes a desired value based on a monitor light-receiving signal, which is input from a monitoring PD which monitors a part of the emitted light of the LD.

An addition-and-subtraction part 105 adds the LD modulation current Imod and the bias current Ibias together, further adds thereto the overshoot current Ios, or subtracts the undershoot current Ius therefrom. A current drive part 106 amplifies a current ILD' provided by the addition-and-subtraction part 105 and provides a drive current ILD to the LD. A control part 117 receives control commands provided by a controller 119 which controls the entirety of an information recording apparatus which includes the above-mentioned light source drive 101, and provides control signals to the respective parts.

Next, a detailed internal configuration of the modulation part 103 will now be described. The modulation part 103 includes a current source 108 which supplies currents I0, I1, and I2 based on the beam-application level data P0Data, P1Data, and P2Data, respectively, which source actually includes respective current sources P0DAC 108a, P1DAC 108b, and P2DAC 108c. Switches 109b and 109c carry out on-off control of the currents I1 and I2 according to the modulation signals Mod1 and Mod2, respectively, and an addition part 110 which adds each current together which the switches 109 output while they are turned on, and supplies an LD modulation current Imod.

Next, a detailed internal configuration of the addition current generation part 118 will now be described. The addition current generation part 118 includes an addition signal generation part 111 which generates addition signals (respectively, ModO and ModU) which specify periods for which the overshoot current Ios and undershoot current Ius are superposed based on the modulation timings which the modulation signal generation part 104 generates. An addition power setting part 116 sets current values I3 and I4 of the overshoot current Ios and undershoot current Ius, and supplies setting data OSData and USData therefor.

Current sources OSDAC 113a and USDAC 113b supply the currents I3 and I4 based on the overshoot current setting data OSData and the undershoot current setting data USData, respectively. Switches 114a and 114b carry out on-off control of the currents I3 and I4 according to the addition signals ModO and ModU, respectively, and thus generate the overshoot current Ios and undershoot current Ius. An addition time setting part 115 sets addition time periods for the overshoot current Ios and undershoot current Ius.

The LD control part 107 may be configured by utilization of a well-known art, and a description of the details thereof will be omitted. The above-mentioned scale signal Iscl should be controlled according to the differential quantum efficiency of the LD so that the bias current Ibias becomes approximately equal to the threshold current Ith.

FIG. 22 shows the waveform showing an example of a main signal of each part shown in FIG. 21. This figure shows a case at a time of recording to a phase-change type recording medium. In FIG. 22, a waveform (c) is a desired light waveform, and record marks of (d) are formed from application of this light waveform. Levels Pb, Pe, and Pw of the light waveform of (c) are respective beam-application levels of a bottom power level, an erase power level, and a light power level, respectively, and are beam-application levels for which the current ILD' is set to (Ibias+I0), (Ibias+I0+I1), and (Ibias+ I0+I2), respectively, as shown. That is, the beam-application levels are determined by the beam-application level data P0Data, P1Data, and P2Data, which set the current values I0, I1, and I2, respectively.

In FIG. 22, a power level Pw2 is a beam-application level obtained from addition of a certain power to the above-mentioned write power level Pw, and the certain power added (Pw2−Pw) corresponds to the above-mentioned current I3. Similarly, a power level Pb2 is a beam-application level obtained from subtraction of a certain power from the above-mentioned bottom power level Pb, which certain power subtracted corresponds to the above-mentioned current I4.

Then, as shown in FIG. 22, (d), a front edge part 'a' of a record mark is formed with a top pulse TP, shown in FIG. 22, (c), and a cooling pulse subsequent thereto; a rear edge part 'c' of the record mark is formed with a last pulse LP and a cooling pulse subsequent thereto; and intermediate parts 'b1' and 'b2' of the record mark are formed with intermediate pulses MP and cooling pulses subsequent thereto, respectively. Thus, the one record mark corresponding to the record data Wdata shown in FIG. 22, (b) is formed.

The modulation signals Mod1 of (e-1) and Mod2 of (e-2) in FIG. 22 are generated corresponding to the record data Wdata of (b) based on drive waveform information that indicates desired modulation timing of the light waveform beforehand set in the modulation signal generation part 104.

The addition signal ModO of (f-1) shown in the figure is generated so as to have a high level only during the addition time periods (To1, To2, To3) for the overshoot current according to instructions coming from the addition time setting part 115 in synchronization with the rising-up of the modulation signal Mod1 or Mod2 in the addition signal generation part 111. These addition time periods To1, To2 and To3 indicate the addition time periods for the above-mentioned pulses TP, MP and LP. Thereby, the overshoot current Ios is generated and is added to the LD drive current.

Similarly, the addition signal ModU of (f-2) shown in FIG. 22 is generated so as to have a high level only during addition time periods (Tu1, Tu2, Tu3) for the undershoot current according to instructions coming from the addition time setting part 115 synchronized with the decaying-down of the modulation signal Mod2. According to these modulation signals and addition signals, the drive current ILD is produced, and, according thereto, the light waveform shown in FIG. 22, (c) is obtained.

In other words, the addition power is added at a time of each rising-up of heating pulse, while the addition power is subtracted at a time of each decaying-down of the heating pulse (or at the top of each cooling pulse).

Figure 23:
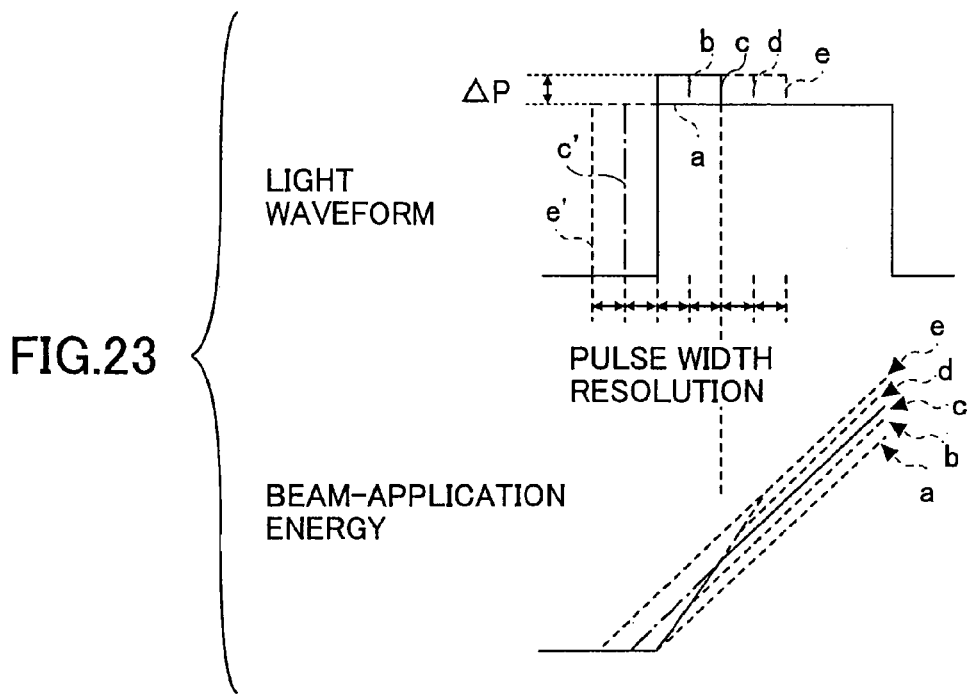
FIG. 23 shows waveforms illustrating a relationship between a heating pulse having an addition power added thereto and a beam-application energy occurring therefrom.

FIG. 23 shows a relation between the heating pulse having the above-mentioned addition power added thereto, and the beam-application energy applied thereby to the optical recording medium. In this figure, a light waveform (a) is a waveform obtained when an addition power ΔP is not added, and light waveforms (b) through (e) are waveforms obtained when the addition power is added one by one, respectively.

Since the beam-application energy is obtained from integration of the beam-application power, the beam-application energies corresponding to the respective light waveforms (a) through (e) are those shown in FIG. 23. Light waveforms (c') and (e') shown are those for which the beam-application power is controlled not by addition of the addition power but by elongating the heating pulse width. These waveforms (c') and (e') have the beam-application energies same as those of the waveforms (c) and (e), respectively.

As mentioned above, formation of a record mark is achieved from heating of the recording material of the recording medium. There, by improving the resolution of the beam-application energy applied to the recording material, a thermal transformation of the recording medium can be controlled at high accuracy. Thereby, high-accuracy mark formation control is achieved.

Thus, according to the seventh embodiment of the present invention described above with reference to FIGS. 21, 22 and 23, the resolution of the beam-application energy is increased by controlling the pulse width of the addition power which is added to the heating pulse, without increasing the time-axis resolution of the heating pulse itself. Thereby, it becomes possible to achieve high-accuracy mark formation control easily. This scheme is advantageous especially in a case of high-speed recording where further improvement of pulse width resolution is difficult. In fact as shown in FIG. 23, finer control of beam-application energy can be achieved by controlling the pulse width of the addition power than by controlling the pulse width of the heating pulse itself. That is, the beam-application energy control can be made twice, i.e., in possible steps of (c), (d) and (e). by utilization of the addition power than merely in possible steps of (c') and (e') only with the conventional pulse width control of heating pulse, with the same pulse width resolution.

Similarly, as to the cooling pulse, by subtracting the addition power therefrom, it becomes possible to finely control the cooling speed, and, thus, more accurate mark formation control is attained.

Moreover, by adjusting the addition signal pulse widths. (To1, To2, To3, and Tu1, Tu2, Tu3) for which the addition-powers are added to or subtracted from the top pulse TP, the intermediate pulses MP, and the last pulse LP, respectively, the form of the front edge part, the intermediate parts, and the rear edge part of the record mark can be shaped with sufficient accuracy, and thus an accurate record mark can be formed uniformly.

In some type of optical recording medium, as it has a high heat conductivity, a formation of a record mark may be influenced by adjacent record marks, and thereby, an edge shift phenomenon may occur, due to a heat storage effect. In particular, in a pigment-system write-once-type recording medium, this tendency is remarkable in general. For solving this problem, conventionally, the pulse width of a recording pulse is controlled according to the lengths of spaces occurring before and after a relevant record mark. However, as in the same reason as that mentioned above, in case of high-speed recording, it is difficult to finely control the time-axis resolution for the purpose of the above-mentioned control in response to the lengths of spaces before and after the relevant record mark.

A first variant embodiment of the above-mentioned seventh embodiment of the present invention will now be described which can solve this problem. Description duplicate with that made for the seventh embodiment will be omitted.

According to the first variant embodiment of the seventh embodiment, the modification signal generation part 104 shown in FIG. 22 measures the run length of the record data Wdata input, and supplies information concerning a mark length Ml, an immediately preceding space length S0, and an immediately subsequent space length S1, to the addition time setting part 115. Simultaneously, the modification signals Mod1 and Mod2 are also generated based on these lengths M1, S0, and S1.

The addition time setting part 115 determines the addition times (To1, To2, To3, and Tu1, Tu2, Tu3) according to the lengths M1, S0, and S1 which are supplied thereto, and supplies thus-determined time data to the addition signal generation part 111.

Thereby, the beam-application energy can be adjusted in consideration of the heat transferred from the adjusted record marks, and, thus, a highly precisely controlled record mark can be formed.

In addition, reduction in the circuit size can also be attained while the above-mentioned advantage is maintained, when the information of run-length which has a higher influence is particularly used for correcting each addition time accordingly.

Specifically, the addition times To1 and Tu1 may be determined for the top pulse TP according to the immediately preceding space S0 and the mark length M1, while the addition times To3 and Tu3 may be determined for the last pulse LP according to the mark length M1 and the immediately subsequent space length S1. Furthermore, the addition times To2 and Tu2 may be determined for the intermediate pulses MP according to the mark length Ml. Thereby, the effectively simplified control of beam-application energy is achieved.

Next, a second variant embodiment of the seventh embodiment of the present invention will now be described. This second variant embodiment of the seventh embodiment is advantageous in use of an LD which has a delay or rounding in rising-up/decaying-down of a light waveform thereof due to the influence of the junction capacitance of the LD such as that mentioned above.

According to an information recording apparatus according to the second variant embodiment of the seventh embodiment, what is different from the above-mentioned seventh embodiment is that the addition time determined by the above-mentioned addition time setting part 115 is increased by an amount approximately corresponding to a charging/discharging time needed for the junction capacitance of the LD. Assuming that the time period to be added to the addition time is $\Delta t$, $\Delta t$ is determined such that $\Delta t \cdot I3$ corresponds to the charging current needed for the junction capacitance.

Figure 24:
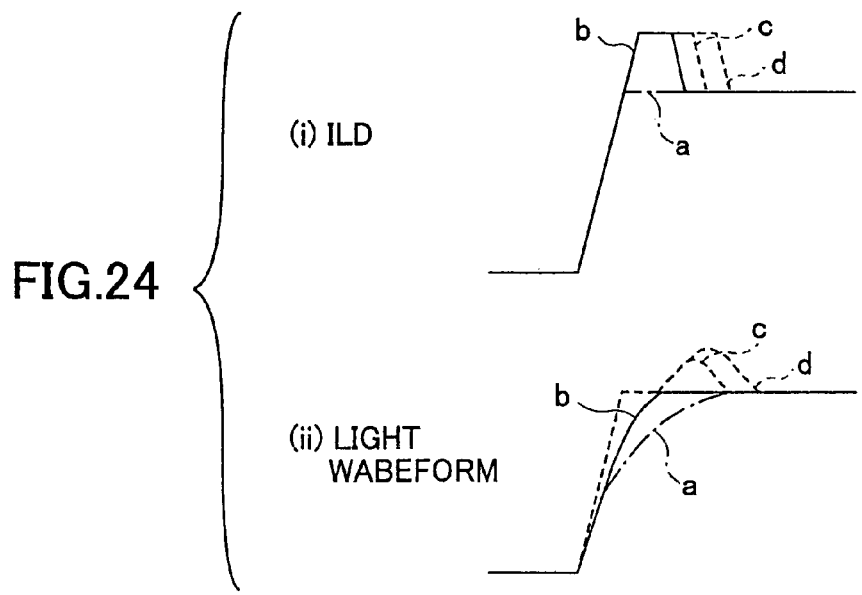
FIG. 24 shows waveforms of an LD drive current and a light waveform for illustrating operation of the seventh embodiment of the present invention.

FIG. 24 shows waveforms of a drive current for the LD and a light waveform, used for illustrating operation of this second variant embodiment of the seventh embodiment.

In FIG. 24, (i), the waveform 'a' of the drive current ILD for the LD is one in a case where the above-mentioned overshoot current Ios is not added on a rising-up of the drive current. Waveforms 'b' through 'd' are those in case where the predetermined addition time of overshoot current Ios is added one by one gradually. In FIG. 24, (ii), a light waveform is shown as an example resulting from each of the above-mentioned drive currents ILD shown in FIG. 24, (i). As for the light waveform 'a', a rising-up is remarkably rounded due to the current consumed to charge the junction capacitance of the LD, and the light waveform 'b' results from a case where the added overshoot current Ios is exactly appropriated for the necessary charging current. The light waveforms 'c' and 'd' are those resulting from a case where the time added is further increased, and, thus, as in the above-mentioned seventh embodiment, the resolution of beam-application energy is increased accordingly.

As parts of the thus-generated overshoot current Ios and undershoot current Ius are used as the charging/discharging currents for the junction current of the LD to drive, it becomes possible to well reduce a delay in time or rounding of rising-up/decaying-down of light waveform effectively. Furthermore, the remaining ones of the applied current are used for adding or subtracting the addition power to/from the heating power, and, thereby, it becomes possible to improve the resolution of beam-application energy applied. As a result, a light can be made to be emitted with a desired light waveform, and exact record mark formation can be performed.

The junction capacitance may differ according to a particular product of the LD applied. Accordingly, it is preferable that the above-mentioned addition current values should be adjusted accordingly. Thereby, appropriate charging/discharging of the junction capacitance of the LD can be achieved, thus, a still more ideal light waveform can be provided, and a more excellent record mark formation can be performed. In the light source drive according to the seventh embodiment and variant embodiments thereof of the present invention, the addition current value setting part 116 executes this function.

Furthermore, the same effect is acquired by adjusting the addition times of overshoot current Ios and undershoot current Ius, instead. In the light source drive of the seventh embodiment and variant embodiments thereof, the addition time setting part 115 executes this function.

It is also possible to combine these functions.

Furthermore, it is further preferable to adjust the current values and/or the addition times of the overshoot current Ios and the undershoot current Ius according to various changes of beam-application levels.

Specifically, according to variation in the beam-application level, i.e., Pe→Pw, Pb→Pw, Pb→Pe), the amounts of change in the potential across the cathode and anode of the relevant LD differ, and thus, the charging/discharging current needed changes accordingly. Then, by controlling the addition times (To1, To2, To3; or Tu1, Tu2, Tu3) according to the thus varying beam-application level shift, the rising-up/delaying-down timing or rounding of the light waveform can be controlled more finely. The same effect can be acquired by controlling the current values.

Thus, according to the seventh embodiment and variant embodiments of the present invention, for a predetermined time period, an addition pulse of predetermined power is added near a rising-up of at least some pulses of a pulse series, and the width of the added pulse is adjusted. Accordingly, without improving the resolution of pulse width, the resolution of beam-application energy can be improved easily and accurate mark formation control is attained. This scheme is advantageous for a case of high-speed recording where further improving of the pulse width resolution is difficult.

Furthermore, according to the seventh embodiment and variant embodiments of the present invention, for a predetermined time period, a first addition pulse of predetermined power is added near a rising-up of at least some pulses of a pulse series, and the width of the added pulse is adjusted as mentioned above. Further, in addition, for a predetermined time period, a second addition pulse of predetermined power is added near a decaying-down of at least some pulses of the pulse series, and the width of the added pulse is also adjusted. Accordingly, without improving the resolution of pulse width, the resolution of beam-application energy can be improved and accurate mark formation control is attained. Also, the cooling speed for cooling the recording medium after heating the same by the heating pulse can be further finely controlled. Accordingly, it becomes possible to more positively achieve accurate control record mark formation.

Furthermore, according to the seventh embodiment and variant embodiments of the present invention, a predetermined addition current is added/subtracted to/from a drive current after and near rising-up/decaying-down of at least part of a pulse series, and a part of thus-added current is made to be used for charging/discharging for the junction capacitance of the LD to drive, while the remaining currents are used for further shaping the light waveform.

Furthermore, a predetermined time for which the addition current is added is controlled. Accordingly, a delay in time/rounding of rising-up/decaying-down of light waveform otherwise occurring due to the junction capacitance of the LD or so can be effectively controlled or well reduced by utilization of a part of the addition current for charging/discharging the junction capacitance. Furthermore, the remaining ones of the addition currents are used for adding/subtracting an addition power to/from the heating pulse/cooling pulse. Thereby, without increasing the pulse width resolution, it becomes possible to easily improve the beam-application energy. Accordingly, the laser beam can be produced with a desired light waveform including the addition pulse.

Further, according to the seventh embodiment and variant embodiments of the present invention, a pulse width added to the top pulse of a pulse sequence, a pulse width added to the last pulse of the same, and a pulse width added to other intermediate pulses may be set, separately. Thereby, a form of the front edge part of a record mark, a form of an intermediate part of the same, and a form of a rear edge part of the same can be controlled with sufficient accuracy, and an accurate record mark can be formed uniformly.

Further, according to the seventh embodiment and variant embodiments of the present invention, by determining the width of the addition pulse according to information before and after the relevant record mark, it becomes possible to well control the beam-application energy in consideration of thermal influence of the adjacent record marks, without improving the pulse width resolution. Thereby, more accurate record mark formation is easily attained.

Furthermore, according to the seventh embodiment and variant embodiments of the present invention, a pulse width added to the top pulse may be determined from the mark length of a relevant record mark as well as the space length of the immediately preceding to the relevant record mark, while a pulse width added to the last pulse may be determined from the mark length of the relevant record mark as well as the space length of the immediately subsequent to the relevant record mark. Thereby, with a simple configuration, it becomes possible to well control the beam-application energy in consideration of thermal influence of the adjacent record marks easily, without improving the pulse width resolution. Thereby, more accurate record mark formation is attained.

Thus, it becomes possible to achieve high-accuracy record mark formation without increasing the resolution of beam-application time period and cooling time period, even for a high-speed recording.

Further, the present invention is not limited to the above-described embodiments, and variations and modifications may be made without departing from the basic concept of the present invention.

The present application is based on Japanese priority applications Nos. 2002-194161 filed on Jul. 3, 2002, 2002-218559 filed on Jul. 26, 2002, and 2003-164054, filed on Jun. 9, 2003, the entire contents of which are hereby incorporated-by reference.

What is claimed is:

1. A light source drive which modulates a light source so as to cause the same to emit a light, comprising:
a superposition current generation part which generates a superposition current approximately corresponding to a charging/discharging current needed for a capacitance occurring in parallel to said light source for a predetermined time period near at least one of a rising-up part and a decaying-down part of a waveform of a drive current of said light source;
an addition/subtraction part which adds to or subtracts from the drive current the superposition current generated by said superposition current generation part; and
an output impedance control part which changes an output impedance value of a drive current output part which provides the drive current to said light source, for a predetermined time period near at least one of a rising-up part and a decaying-down part of a waveform of the drive current.

2. A light source drive which modulates a light source so as to cause the same to emit a light, comprising:
a superposition signal generation part which generates a superposition signal which indicates a predetermined time period near at least one of a rising-up part and a decaying-down part of a waveform of a drive current of said light source;
a superposition current generation part which generates a superposition current approximately corresponding to a charging/discharging current needed for a capacitance occurring in parallel to said light source based on the superposition signal generated by said superposition signal generation part;
an addition/subtraction part which adds to or subtracts from the drive current the superposition current generated by said superposition current generation part; and
an output impedance control part which changes an output impedance value of a drive current output part which provides the drive current to said light source, for a predetermined time period near at least one of a rising-up part and a decaying-down part of a waveform of the drive current.

* * * * *